(12) United States Patent
Kim

(10) Patent No.: US 12,658,280 B2
(45) Date of Patent: *Jun. 16, 2026

(54) METHOD FOR PERFORMING AGING TEST ON SEMICONDUCTOR USED FOR NEURAL NETWORK

(71) Applicant: DEEPX CO., LTD., Seongnam-si (KR)

(72) Inventor: Lok Won Kim, Seongnam-si (KR)

(73) Assignee: DEEPX CO., LTD., Seongnam-si (KR)

( * ) Notice: Subject to any disclaimer, the term of this patent is extended or adjusted under 35 U.S.C. 154(b) by 143 days.

This patent is subject to a terminal disclaimer.

(21) Appl. No.: 18/648,655

(22) Filed: Apr. 29, 2024

(65) Prior Publication Data

US 2024/0274225 A1 Aug. 15, 2024

Related U.S. Application Data

(63) Continuation-in-part of application No. 18/193,313, filed on Mar. 30, 2023, now Pat. No. 12,033,713, (Continued)

(30) Foreign Application Priority Data

Mar. 5, 2022 (KR) ........................ 10-2024-0031476
May 3, 2022 (KR) ........................ 10-2022-0054878

(51) Int. Cl.
*G11C 29/10* (2006.01)
*G05B 19/418* (2006.01)
(Continued)

(52) U.S. Cl.
CPC ........ *G11C 29/78* (2013.01); *G05B 19/41875* (2013.01); *G06F 11/26* (2013.01);
(Continued)

(58) Field of Classification Search
CPC ......... G11C 29/78; G11C 29/10; G11C 29/02; G11C 2029/3602; G11C 29/36;
(Continued)

(56) References Cited

U.S. PATENT DOCUMENTS 6,357,020 B1 3/2002 Bohizic et al.
6,571,359 B1 5/2003 Padwekar et al.
(Continued)

FOREIGN PATENT DOCUMENTS

CN 112506690 A 3/2021
CN 114689961 A 7/2022
(Continued)

OTHER PUBLICATIONS

Lok-Won Kim et al., "Runtime Testability on Autonomous System", IEEE Transaction on Reliability, Apr. 29, 2022.

*Primary Examiner* — Mohammed A Bashar
(74) *Attorney, Agent, or Firm* — Bridgeway IP Law Group, PLLC; Jihun Kim

(57) ABSTRACT

Provided is a method for performing an aging test on a neural processing unit (NPU) with a capability of a runtime test. The method may comprise: performing an aging test on the NPU which comprises a plurality of functional components. The plurality of functional components may comprise at least one memory and plural processing elements. The performing of the aging test may include: performing a scan test on the NPU to verify whether at least one functional component in the NPU is defective or not; and performing a memory test on the at least one memory. At least one of the scan test and the memory test may be repeatedly performed to put a stress on the NPU for the aging test. The aging test may be repeated by a predetermined number.

20 Claims, 20 Drawing Sheets

Related U.S. Application Data which is a continuation of application No. 17/886, 463, filed on Aug. 12, 2022, now Pat. No. 11,651,835.

(51) Int. Cl.
　　*G06F 11/26*　　　(2006.01)
　　*G11C 29/00*　　　(2006.01)
(52) U.S. Cl.
　　CPC .... *G11C 29/10* (2013.01); *G05B 2219/32368* (2013.01); *G05B 2219/45031* (2013.01)
(58) Field of Classification Search
　　CPC ...... G11C 29/56004; G11C 2029/0401; G11C 29/16; G11C 29/4401; G11C 29/56008; G05B 19/41875; G05B 2219/32368; G05B 2219/45031; G06F 11/26
　　See application file for complete search history.

(56)　　　　References Cited

U.S. PATENT DOCUMENTS

| | | |
|---|---|---|
| 11,237,894 B1 | 2/2022 | Baum et al. |
| 11,263,077 B1 | 3/2022 | Seznayov et al. |
| 11,609,269 B2 | 3/2023 | Whetsel |
| 2003/0125908 A1 | 7/2003 | Wynn et al. |
| 2003/0196146 A1 | 10/2003 | Padwekar et al. |
| 2012/0226942 A1 | 9/2012 | Gangasani et al. |
| 2012/0233514 A1 | 9/2012 | Patil et al. |
| 2014/0096097 A1 | 4/2014 | Prasanna et al. |
| 2015/0039950 A1 | 2/2015 | Monroe et al. |
| 2015/0115994 A1 | 4/2015 | Graas et al. |
| 2016/0349320 A1 | 12/2016 | Laisne et al. |
| 2017/0193154 A1 | 7/2017 | Sul |
| 2018/0357143 A1 | 12/2018 | Panambur et al. |
| 2019/0088515 A1 | 3/2019 | Jeong et al. |
| 2019/0154757 A1 | 5/2019 | Lujan et al. |
| 2021/0018590 A1* | 1/2021 | Grau ................. B60W 50/0205 |
| 2021/0286693 A1 | 9/2021 | Alben et al. |
| 2022/0012164 A1 | 1/2022 | Grymel et al. |
| 2022/0100601 A1 | 3/2022 | Baum et al. |
| 2022/0101042 A1 | 3/2022 | Kaminitz et al. |
| 2022/0101043 A1 | 3/2022 | Katz et al. |
| 2022/0101887 A1 | 3/2022 | Han et al. |
| 2022/0103186 A1 | 3/2022 | Kaminitz et al. |
| 2022/0113889 A1 | 4/2022 | Park et al. |
| 2022/0171668 A1 | 6/2022 | Quigley et al. |
| 2022/0206068 A1 | 6/2022 | Kim |
| 2022/0206978 A1 | 6/2022 | Kim |
| 2024/0211740 A1* | 6/2024 | Jeong ................... G06N 3/0495 |

FOREIGN PATENT DOCUMENTS

| | | |
|---|---|---|
| EP | 1923788 A2 | 5/2008 |
| WO | 2005/029329 A2 | 3/2005 |
| WO | 2016/191013 A1 | 12/2016 |
| WO | 2016/200718 A1 | 12/2016 |
| WO | 2017/017691 A1 | 2/2017 |

* cited by examiner

FIG. 7A

METHOD FOR PERFORMING AGING TEST ON SEMICONDUCTOR USED FOR NEURAL NETWORK

CROSS-REFERENCE TO RELATED APPLICATIONS

This application claims the priority of Korean Patent Application No. 10-2024-0031476 filed on Mar. 5, 2024, in the Korean Intellectual Property Office, the disclosure of which is incorporated herein by reference.

This application is also a Continuation-in-Part (CIP) of U.S. Ser. No. 18/193,313, filed on Mar. 30, 2023, which is hereby incorporated by reference in their entirety.

The above-mentioned U.S. Ser. No. 18/193,313 is a continuation of U.S. patent application Ser. No. 17/886,463 filed on Aug. 12, 2022, which claims the priority of Korean Patent Application No. 10-2022-0054878 filed on May 3, 2022, in the Korean Intellectual Property Office, the disclosure of which is incorporated herein by reference.

BACKGROUND OF THE DISCLOSURE

Technical Field

The present disclosure relates to a method of performing an aging test.

Background Art

Artificial intelligence (AI) is gradually developing. AI refers to intelligence which artificially imitates human intelligence, that is, intelligence for recognition, classification, inference, prediction, control/decision making, etc.

Recently, in order to accelerate an operation speed for artificial intelligence (AI), a neural processing unit (NPU) is being developed.

On the other hand, as the semiconductor density increases, the manufacturing cost becomes cheaper, but the defect rate also increases as the complexity increases.

SUMMARY OF THE DISCLOSURE

The design of integrated circuits (ICs) is becoming increasingly complex, and the level of integration is increasing significantly. NPUs are semiconductors with a very high level of integration and defects in some functional components may cause a decrease in overall system performance. Therefore, it is becoming increasingly important to test the functional components within the NPU to identify defects.

The inventor of the present disclosure has recognized that defect during the manufacturing process may be found during the test before the shipment from the factory, but minor defects for some components are not found by the test before the factory shipment and may be handed over to users.

Such a minute defect is gradually amplified due to a fatigue stress or a physical stress by repeated usage to finally cause an erroneous operation of the NPU.

When the NPU is mounted in electronics applied for user entertainment, its erroneous operation may not be so problematic. However, the inventor of the present disclosure has recognized that when the NPU is mounted in a mission-critical product, the situation is different.

Specifically, the inventor of the present disclosure has recognized a problem in that when the NPU erroneously operates due to the failure, defect, or damage, unpredictable artificial intelligence (AI) operation results may be output.

For example, the inventor of the present disclosure has recognized that when the NPU is used for an electronic device mounted in an autonomous driving vehicle, a drone, Urban Air 'Mobility (UAM), Unmanned Aerial Vehicle (UAV), or used for an electronic device mounted in an AI robot, the unpredictable AI operation results may be output due to the failure, defect, or damage of the NPU.

Therefore, the inventor of the present disclosure has recognized that it is necessary to propose a method for performing a test, heretofore performed only before factory shipment, in the NPU in the runtime.

In other words, it was recognized that it was necessary to detect defects through testing.

According to an example of the present disclosure, a method for performing an aging test on a neural processing unit (NPU) with a capability of a runtime test may be provided. The method may comprise: performing an aging test on the NPU having a plurality of functional components. The plurality of functional components may comprise at least one memory and a plurality of processing elements. The performing of the aging test may include: performing a scan test on the NPU to verify whether at least one functional component of the plurality of functional components in the NPU is defective or not; and performing a memory test on the at least one memory. At least one of the scan test and the memory test may be repeatedly performed to put a stress on the NPU for the aging test. The aging test may be repeated by a predetermined number.

According to an example of the present disclosure, a method for performing an aging test on a system on chip (SoC) with a first capability for an artificial neural network and a second capability of a runtime test may be provided. The method may comprise: performing an aging test on the SoC having a plurality of electronic circuitry having a plurality of functional components. The plurality of functional components may comprise at least one neural processing unit (NPU), a first memory and a system bus. The performing of the aging test may include: performing a scan test on the SoC to verify whether at least one functional component of the plurality of functional components in the SoC is defective or not; and performing a memory test on SoC. At least one of the scan test and the memory test may be repeatedly performed to put a stress on the SoC for the aging test. The aging test may be repeated by a predetermined number.

Accordingly, examples of the present disclosure may enable early or rapid detection of errors or defects in a semiconductor for a neural network, thereby improving the reliability of the semiconductor for the neural network.

BRIEF DESCRIPTION OF THE DRAWINGS

FIG. 7A is a block diagram illustrating a configuration of an SoC, according to a first example.

DETAILED DESCRIPTION OF THE EMBODIMENT

Figure 1:
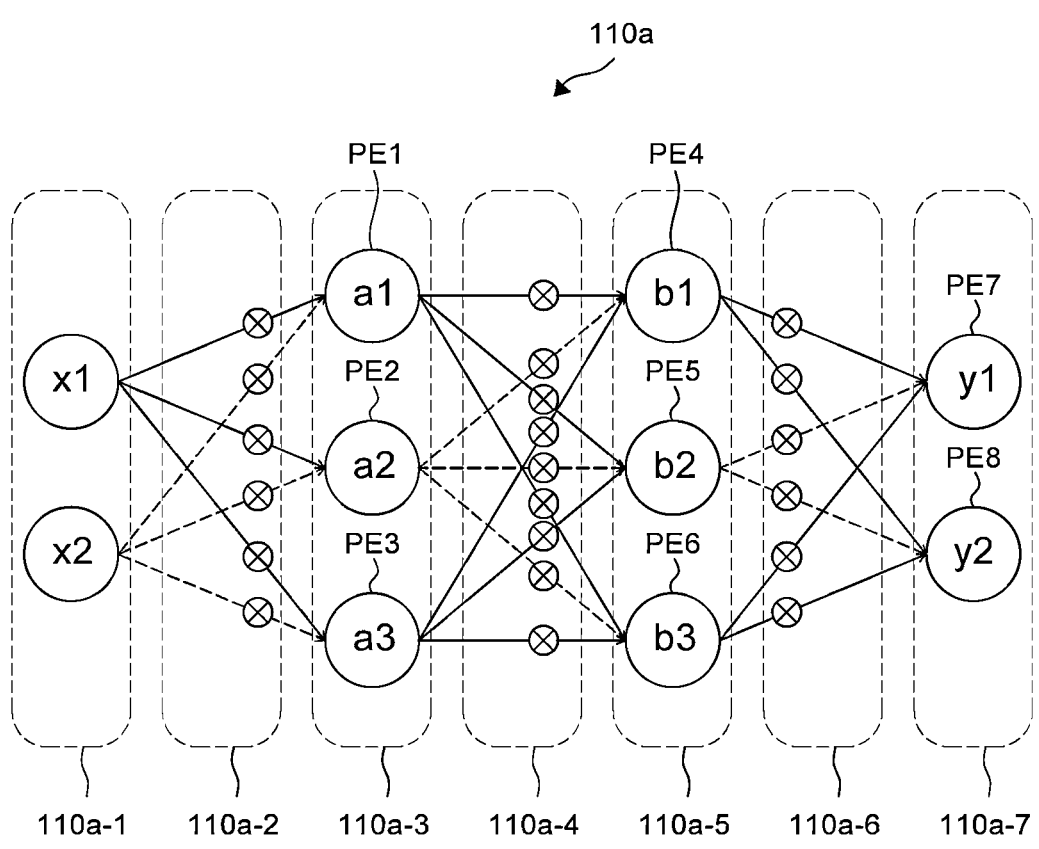
FIG. 1 is a schematic diagram illustrating an exemplary artificial neural network model.

Specific structural or step-by-step descriptions for the embodiments according to the concept of the present disclosure disclosed in the present specification or application are merely illustrative for the purpose of describing the embodiments according to the concept of the present disclosure. The examples according to the concept of the present disclosure may be carried out in various forms and are not interpreted to be limited to the examples described in the present specification or application.

Various modifications and changes may be applied to the examples in accordance with the concept of the present disclosure and the examples may have various forms so that the examples will be described in detail in the specification or the application with reference to the drawings. However, it should be understood that the examples according to the concept of the present disclosure is not limited to the specific examples, but includes all changes, equivalents, or alternatives which are included in the spirit and technical scope of the present disclosure.

Terminologies such as first and/or second may be used to describe various components but the components are not limited by the above terminologies. The above terminologies are used to distinguish one component from the other component, for example, a first component may be referred to as a second component without departing from a scope in accordance with the concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. In contrast, when it is described that an element is "directly coupled" or "directly connected" to another element, it should be understood that no element is present therebetween. Other expressions which describe the relationship between components, for example, "between," "adjacent to," and "directly adjacent to" should be interpreted in the same manner.

Terminologies used in the present specification are used only to describe specific examples, and are not intended to limit the present disclosure. A singular form may include a plural form if there is no clearly opposite meaning in the context. In the present specification, it should be understood that terms "include" or "have" indicate that a feature, a number, a step, an operation, a component, a part, or a combination thereof described in the specification is present, but do not exclude a possibility of presence or addition of one or more other features, numbers, steps, operations, components, parts, or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if it is not clearly defined in this specification.

When the examples are described, a technology which is well known in the technical field of the present disclosure and is not directly related to the present disclosure will not be described. The reason is that unnecessary description is omitted to clearly transmit the gist of the present disclosure without obscuring the gist.

Definition of Terminologies

Here, in order to help the understanding of the disclosure proposed in the present specification, terminologies used in the present specification will be defined in brief.

NPU is an abbreviation for a neural processing unit and refers to a processor specialized for an operation of an artificial neural network model separately from the central processing unit (CPU).

ANN is an abbreviation for an artificial neural network and refers to a network which connects nodes in a layered structure by imitating the connection of the neurons in the human brain through a synapse to imitate the human intelligence.

DNN is an abbreviation for a deep neural network and may mean that the number of hidden layers of the artificial neural network is increased to implement higher artificial intelligence.

CNN is an abbreviation for a convolutional neural network and is a neural network which functions similar to the image processing performed in a visual cortex of the human brain. The convolutional neural network is known to be appropriate for image processing and is known to be easy to extract features of input data and identify the pattern of the features.

Hereinafter, the present disclosure will be described in detail by explaining examples of the present disclosure with reference to the accompanying drawings.

<Artificial Intelligence>

Humans are equipped with intelligence capable of recognition, classification, inference, prediction, control/decision making, and the like. Artificial intelligence (AI) refers to the artificial imitation of human intelligence.

The human brain consists of numerous nerve cells called neurons. Each neuron is connected to hundreds to thousands of other neurons through connections called synapses. In order to imitate human intelligence, modeling the operating principle of biological neurons and the connection between neurons is called an artificial neural network model. In other words, an artificial neural network is a system in which nodes that imitate neurons are connected in a layer structure.

These artificial neural network models are divided into 'single-layer neural networks' and 'multi-layer neural network' according to the number of layers. A typical multi-layer neural network consists of an input layer, a hidden layer, and an output layer. (1) The input layer is a layer that receives external data, and the number of neurons in the input layer is the same as the number of input variables. (2) The hidden layer is located between the input layer and the output layer, receives signals from the input layer, extracts characteristics, and transfers them to the output layer. (3) The output layer receives signals from the hidden layer and outputs the result. The input signal between neurons is multiplied by each connection weight having a value between 0 and 1 and summed. If this sum is greater than the neuron's threshold, the neuron is activated and implemented as an output value through an activation function.

Meanwhile, in order to implement higher artificial intelligence, an artificial neural network in which the number of hidden layers is increased is called a deep neural network (DNN).

DNNs are being developed in various structures. For example, a convolutional neural network (CNN), which is an example of DNN, is known to be easy to extract features of an input value (video or image) and identify a pattern of the extracted output value. A CNN may be configured in a form in which a convolution operation, an activation function operation, a pooling operation, and the like are processed in a specific order.

For example, in each layer of the DNN, parameters (i.e., input values, output values, weights or kernels, and the like) may be a matrix composed of a plurality of channels. Parameters can be processed in the NPU by convolution or matrix multiplication. In each layer, an output value that has been processed is generated.

For example, a transformer is a DNN based on attention technology. Transformers utilize a number of matrix multiplication operations. The transformer may obtain an output value of attention (Q, K, V) by using parameters such as an input value and a query (Q), a key (K), and a value (V). The transformer can process various inference operations based on the output value (i.e., attention (Q, K, V)). Transformers tend to show better inference performance than CNNs.

FIG. 1 illustrates an exemplary artificial neural network model.

Hereinafter, an operation of an exemplary artificial neural network model 110a which may operate in the neural processing unit 100 will be explained.

The exemplary artificial neural network model 110a of FIG. 1 may be an artificial neural network trained to perform various inference functions such as object detection or voice recognition.

The artificial neural network model 110a may be a deep neural network (DNN).

However, the artificial neural network model 110a according to the examples of the present disclosure is not limited to the deep neural network.

For example, the artificial neural network model can be a model such as DaViT, MobileViT, Swin-Transformer, Transformer, YOLO (You Only Look Once), CNN, PIDNet, BiseNet, RCNN, VGG, VGG16, DenseNet, SegNet, DeconvNet, DeepLAB V3+, U-net, SqueezeNet, Alexnet, ResNet18, MobileNet-v2, GoogLeNet, Resnet-v2, Resnet50, Resnet101, Inception-v3, and the like. However, the artificial neural network model 110a may be an ensemble model based on at least two different models.

Hereinafter, an inference process by the exemplary artificial neural network model 110a will be described.

The artificial neural network model 110a may be an exemplary deep neural network model including an input layer 110a-1, a first connection network 110a-2, a first hidden layer 110a-3, a second connection network 110a-4, a second hidden layer 110a-5, a third connection network 110a-6, and an output layer 110a-7. However, the present disclosure is not limited only to the artificial neural network model illustrated in FIG. 1. The first hidden layer 110a-3 and the second hidden layer 110a-5 may also be referred to as a plurality of hidden layers.

The input layer 110a-1 may exemplarily include input nodes x1 and x2. That is, the input layer 110a-1 may include information about two input values.

For example, the first connection network 110a-2 may include information about six weight values for connecting nodes of the input layer 110a-1 to nodes of the first hidden layer 110a-3, respectively. Each weight value is multiplied with the input node value, and an accumulated value of the multiplied values is stored in the first hidden layer 110a-3. Here, the nodes and weights may be referred to as parameters.

For example, the first hidden layer 110a-3 may include nodes a1, a2, and a3. That is, the first hidden layer 110a-3 may include information about three node values.

The first processing element PE1 of FIG. 1 may perform the MAC operation of the a1 node.

The second processing element PE2 of FIG. 1 may perform the MAC operation of the a2 node.

The third processing element PE3 of FIG. 1 may perform the MAC operation of the a3 node.

For example, the second connection network 110a-4 may include information about nine weight values for connecting nodes of the first hidden layer 110a-3 to nodes of the second hidden layer 110a-5, respectively. The weight value of the second connection network 110a-4 is multiplied with the node value input from the corresponding first hidden layer 110a-3 and the accumulated value of the multiplied values is stored in the second hidden layer 110a-5.

For example, the second hidden layer 110a-5 may include nodes b1, b2, and b3. That is, the second hidden layer 110a-5 may include information about three node values.

The fourth processing element PE4 of FIG. 1 may process the operation of the b1 node.

The fifth processing element PE5 of FIG. 1 may process the operation of node b2.

The sixth processing element PE6 of FIG. 1 may process the operation of node b3.

For example, the third connection network 110a-6 may include information about six weight values which connect nodes of the second hidden layer 110a-5 and nodes of the output layer 110a-7, respectively. The weight value of the third connection network 110a-6 is multiplied with the node value input from the second hidden layer 110a-5, and the accumulated value of the multiplied values is stored in the output layer 110a-7.

For example, the output layer 110a-7 may include nodes y1 and y2. That is, the output layer 110a-7 may include information about two node values.

The seventh processing element PE7 of FIG. 1 may process the operation of node y1.

The eighth processing element PE8 of FIG. 1 may process the operation of node y2.

Each node may correspond to a feature value, and the feature value may correspond to a feature map.

Figure 2A:
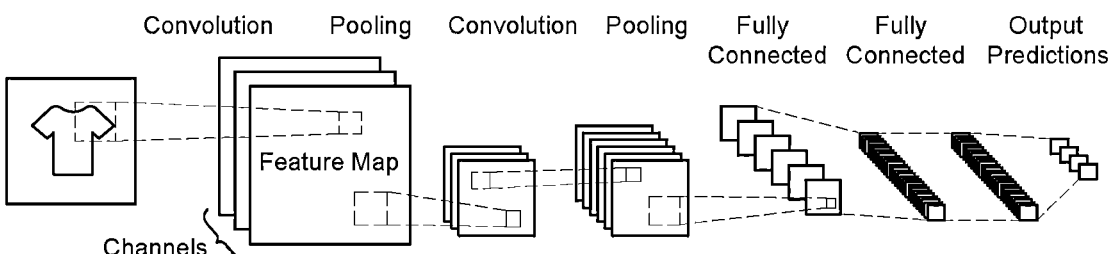
FIG. 2A is a diagram illustrating the basic structure of a convolutional neural network (CNN).

FIG. 2A is a diagram for explaining the basic structure of a convolutional neural network (CNN).

Referring to FIG. 2A, an input image may be displayed as a two-dimensional matrix composed of rows of a specific size and columns of a specific size. An input image may have a plurality of channels, where the channels may represent the number of color components of the input data image.

The convolution process means performing a convolution operation with a kernel while traversing the input image at specified intervals.

A convolutional neural network may have a structure in which an output value (convolution or matrix multiplication) of a current layer is transferred as an input value of a next layer.

For example, convolution is defined by two main parameters (input feature map and kernel). Parameters may include input feature maps, output feature maps, activation maps, weights, kernels, attention (Q, K, V) values, and the like.

Convolution slides the kernel window over the input feature map. The step size by which the kernel slides over the input feature map is called the stride.

After convolution, pooling may be applied. In addition, a fully-connected (FC) layer may be disposed at an end of the convolutional neural network.

Figure 2B:
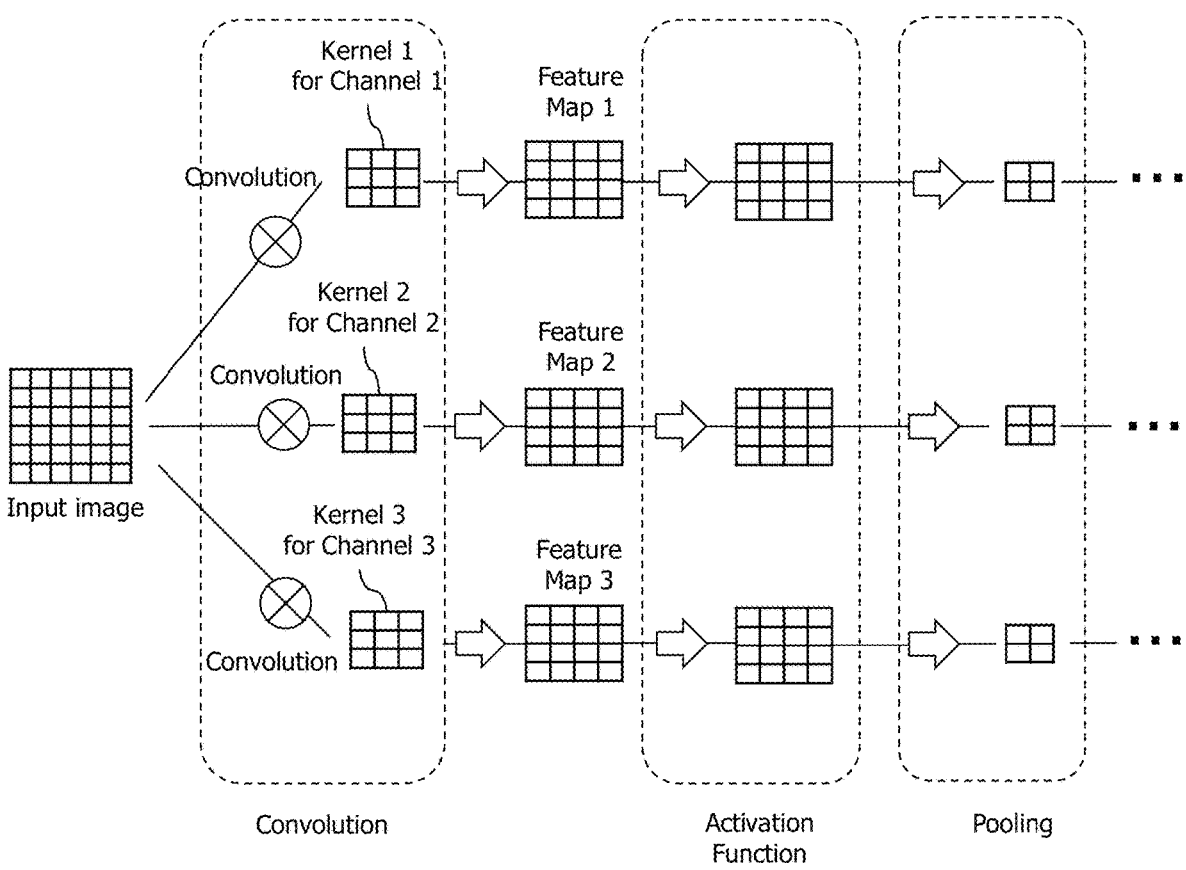
FIG. 2B is a composite diagram illustrating the operation of a convolutional neural network.

FIG. 2B is a comprehensive diagram illustrating the operation of a convolutional neural network.

Referring to FIG. 2B, an input image is exemplarily represented as a two-dimensional matrix having a size of 6×6. In addition, FIG. 2B exemplarily illustrates three nodes, channel 1, channel 2, and channel 3.

First, the convolution operation will be described.

The input image (shown as an example of size 6×6 in FIG. 2B) is convolved with a kernel 1 (shown as an example of size 3×3 in FIG. 2B) for channel 1 at the first node, resulting in the output feature map 1 (shown as an example of size 4×4 in FIG. 2B). Similarly, the input image (shown as an example of size 6×6 in FIG. 2B) is convolved with a kernel 2 (shown as an example of size 3×3 in FIG. 2B) for channel 2 at the second node, resulting in the output feature map 2 (shown as an example of size 4×4 in FIG. 2B). Additionally, the input image is convolved with a kernel 3 (shown as an example of size 3×3 in FIG. 2B) for channel 3 at the third node, resulting in the output feature map 3 (shown as an example of size 4×4 in FIG. 2B).

To process each convolution, the processing elements PE1 to PE12 of the neural processing unit 100 are configured to perform a MAC operation.

Next, the operation of the activation function will be described.

The feature map 1, the feature map 2, and the feature map 3 (which are represented as 4×4 examples in FIG. 2B) generated from convolutional operations can be subjected to activation functions. The output after the activation function is applied may have a size of 4×4, for example.

Next, a pooling operation will be described.

Feature map 1, feature map 2, and feature map 3 output from the activation function (each size is exemplarily represented as 4×4 in FIG. 2B) are input to three nodes. Pooling may be performed by receiving feature maps output from the activation function as inputs. The pooling may reduce the size or emphasize a specific value in the matrix. Pooling methods include maximum pooling, average pooling, and minimum pooling. Maximum pooling is used to collect the maximum values in a specific region of the matrix, and average pooling can be used to find the average within a specific region.

In the example of FIG. 2B, it is shown that a feature map having a size of 4×4 is reduced to a size of 2×2 by pooling.

Specifically, the first node receives feature map 1 for channel 1 as an input, performs pooling, and outputs, for example, a 2×2 matrix. The second node receives feature map 2 for channel 2 as an input, performs pooling, and outputs, for example, a 2×2 matrix. The third node receives feature map 3 for channel 3 as an input, performs pooling, and outputs, for example, a 2×2 matrix.

The aforementioned convolution, activation function, and pooling are repeated, and finally, it can be output as fully connected. The corresponding output may be input again to an artificial neural network for image recognition. However, the present disclosure is not limited to the sizes of feature maps and kernels.

The CNN described so far is the most used method in the field of computer vision among various deep neural network (DNN) methods. In particular, CNNs have shown remarkable performance in various research areas performing various tasks such as image classification and object detection.

<Required Hardware Resources for ANN>

Figure 3:
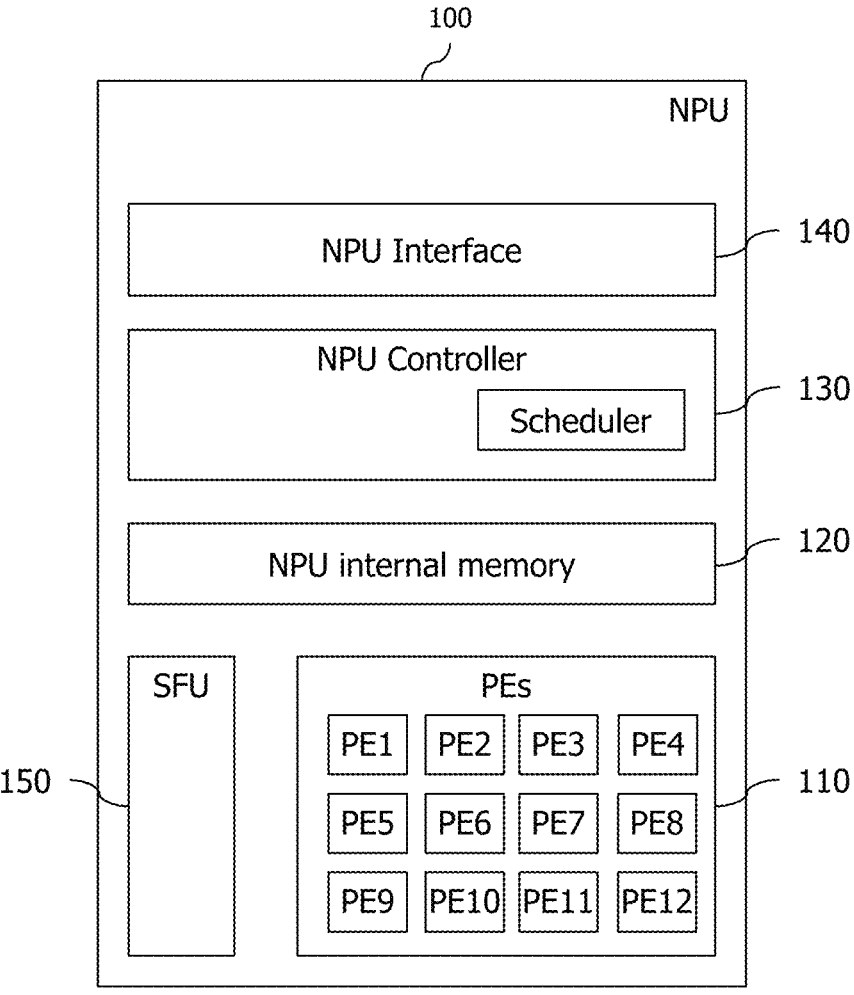
FIG. 3 is a schematic conceptual diagram illustrating a neural processing unit in accordance with one example of the present disclosure.

FIG. 3 is a schematic conceptual diagram illustrating a neural processing unit according to the present disclosure.

Referring to FIG. 3, a neural processing unit (NPU) 100 is a processor specialized to perform an operation for an artificial neural network.

The artificial neural network refers to a network that consists of artificial neurons which, when receiving various inputs or entry stimulations, multiply a weight by the inputs or stimulations, add the multiplied values, and convert a value obtained by additionally adding a deviation using an active function to transmit. The artificial neural network trained as described above may be used to output an inference result from input data.

The neural processing unit 100 may be a semiconductor device implemented by an electric/electronic circuit. The electric/electronic circuit may refer to a circuit including a large number of electronic elements (transistors, capacitors, and the like).

In the case of a transformer and/or CNN-based artificial neural network model, the neural processing unit 100 may select and process matrix multiplication operations, convolution operations, and the like according to the architecture of the artificial neural network.

For example, in each layer of a convolutional neural network (CNN), an input feature map corresponding to input data and a kernel corresponding to weights may be a tensor or matrix composed of a plurality of channels. A convolution operation between the input feature map and the kernel is performed, and a convolution operation and a pooled output feature map are generated in each channel. An activation map of a corresponding channel is generated by applying an activation function to the output feature map. After that, pooling for the activation map may be applied. Here, the activation map may be collectively referred to as an output feature map. For convenience of explanation, the activation map may be referred to as an output feature map.

However, examples of the present disclosure are not limited thereto, and the output feature map means that a matrix multiplication operation or a convolution operation is applied.

To elaborate, the output feature map according to the examples of the present disclosure should be interpreted in a comprehensive sense. For example, the output feature map may be a result of a matrix multiplication operation or a convolution operation. Accordingly, the plurality of processing elements 110 may be modified to further include processing circuitry for processing additional algorithms. That is, some circuit units of the SFU 150 to be described later may be configured to be included in the plurality of processing elements 110.

The neural processing unit 100 may be configured to include a plurality of processing elements 110 for processing convolution and matrix multiplication necessary for the above-described artificial neural network operation.

The neural processing unit 100 may be configured to include each processing circuit optimized for matrix-multiplication operation, convolution operation, activation function operation, pooling operation, stride operation, batch-normalization operation, skip-connection operation, concatenation operation, quantization operation, clipping operation, padding operation, and the like required for the above-described artificial neural network operation.

For example, the neural processing unit 100 may be configured to include the SFU 150 for processing at least one of activation function operation, pooling operation, stride operation, batch-normalization operation, skip-connection operation, concatenation operation, quantization operation, clipping operation, and padding operation for the above-described algorithms.

The neural processing unit 100 may include a plurality of processing elements (PE) 110, an NPU internal memory 120, an NPU controller 130, and an NPU interface 140. Each of the plurality of processing elements 110, the NPU internal memory 120, the NPU controller 130, and the NPU interface 140 may be a semiconductor circuit to which a large number of the electronic elements are connected. Therefore, some of electronic elements may be difficult to identify or be distinguished with the naked eye, but may be identified only by a circuitry operation.

For example, an arbitrary circuit may operate as a plurality of the processing elements 110, or may operate as an NPU controller 130. The NPU controller 130 may be configured to perform the function of the control unit that is configured to control the artificial neural network inference operation of the neural processing unit 100.

The neural processing unit 100 may include a NPU controller 130 including an NPU internal memory 120 configured to store parameters of an artificial neural network model that can be inferred from the plurality of processing elements 110 and the SFU 150 and a scheduler configured to control operation schedules of the plurality of processing elements 110, the SFU 150, and the NPU internal memory 120.

The neural processing unit 100 may be configured to process the feature map corresponding to the encoding and decoding method using scalable video coding (SVC) or scalable feature-map coding (SFC). The above schemes are technologies that variably vary the data transmission rate according to the effective bandwidth and signal to noise ratio (SNR) of a communication channel or communication bus. That is, the neural processing unit 100 may be configured to further include an encoder and a decoder.

The plurality of processing elements 110 may perform a portion of the operations for an artificial neural network.

SFU 150 may perform another portion of the operation for the artificial neural network.

The neural processing unit 100 may be configured to hardware-accelerate the computation of the artificial neural network model using the plurality of processing elements 110 and the SFU 150.

The NPU interface 140 may communicate with various components connected to the neural processing unit 100, for example, memories, via a system bus.

The NPU controller 130 may include a scheduler configured to control the operation of multiple processing elements 110 for inference operations of a neural processing unit 100, as well as operations of the SFU 150 and reading and writing order of the internal memory 120 of the NPU.

The scheduler in the NPU controller 130 may be configured to control the plurality of processing elements 110, the SFU 150, and the NPU internal memory 120 based on data locality information or structure information of the artificial neural network model.

The schedular in the NPU controller 130 may analyze or receive analyzed information on a structure of an artificial neural network model which may operate in the plurality of processing elements 110. The analyzed information may be information generated by a compiler. For example, data of the artificial neural network, which may be included in the artificial neural network model may include node data (i.e., feature map) of each layer, data on a layout of layers, locality information of layers or information about the structure, and at least a portion of weight data (i.e., weight kernel) of each of connection networks connecting the nodes of the layers. The data of the artificial neural network may be stored in a memory provided in the NPU controller 130 or the NPU internal memory 120. However, it is not limited thereto, and the data of the artificial neural network may be stored in a separate cache memory or register file provided in the NPU or SoC including the NPU.

The scheduler in the NPU controller 130 may receive scheduling information of an operation sequence of the artificial neural network model to be performed by the neural processing unit 100 based on data locality information or structure information of the compiled artificial neural network model. For example, the scheduling information may be information generated by a compiler. Scheduling information generated by the compiler may be referred to as machine code or binary code.

That is, the scheduling information utilized by the NPU controller 130 may be information generated by a compiler based on data locality information or structure of an artificial neural network model.

In other words, the compiler can efficiently schedule NPUs depending on how well the compiler understands and reconstructs the locality of artificial neural network data, which is a unique characteristic of artificial neural network models.

In other words, the compiler can efficiently schedule the NPU according to how well the compiler understands the hardware structure and performance of the neural processing unit 100.

In other words, when the artificial neural network model is compiled to be executed in the neural processing unit 100 by the compiler, the artificial neural network data locality may be reconstructed. The artificial neural network data locality can be reconstructed according to the algorithms applied to the artificial neural network model and the operating characteristics of the processor.

To elaborate, the artificial neural network data locality can be reconstructed according to a method in which the neural processing unit 100 processes the corresponding artificial neural network model, for example, feature map tiling or a stationary method of processing elements.

To elaborate, artificial neural network data locality can be reconstructed according to the number of processing elements of the neural processing unit 100 and the capacity of the internal memory.

To elaborate, the artificial neural network data locality can be reconstructed according to the bandwidth of the memory communicating with the neural processing unit 100.

This is because the neural processing unit 100 may differently determine the order of necessary data at each moment in each clock cycle even though the same artificial neural network model is operated and processed by each of the factors described above.

Based on the order of data required for the operation of the artificial neural network model, the compiler may determine data locality and generate compiled machine code based on the order of operation of the layers, convolutions and/or matrix multiplications of the artificial neural network.

The scheduler may be configured to utilize scheduling information contained in machine code. The scheduler in the NPU controller 130 may obtain a memory address value in which the feature map and weight data of the layer of the artificial neural network model are stored based on the scheduling information.

For example, the scheduler in the NPU controller 130 may acquire the memory address value of the feature map of the layer of the artificial neural network model and the weight data which are stored in the memory. Accordingly, the scheduler in the NPU controller 130 may acquire feature map of a layer and weight data of an artificial neural network model to be driven from the main memory, to store the acquired data in the NPU internal memory 120.

Feature map of each layer may have a corresponding memory address value.

Each of the weight data may have a corresponding memory address value.

The scheduler in the NPU controller 130 may be provided with scheduling information about the order of operations of the plurality of processing elements 110 based on information about data locality or structure of the artificial neural network model, such as layout information, locality information, or structure of layers of the artificial neural network of the artificial neural network model. The scheduling information may be generated in a compilation step.

The scheduler in the NPU controller 130 may operate differently from conventional CPU scheduling concepts because it operates based on scheduled information based on information about data locality or structure in the artificial neural network model. The scheduling of the normal CPU operates to provide the highest efficiency in consideration of fairness, efficiency, stability, and reaction time. That is, the normal CPU schedules to perform the most processing during the same time in consideration of a priority and an operation time.

A conventional CPU uses an algorithm which schedules a task in consideration of data such as a priority or an operation processing time of each processing.

In contrast, the scheduler in the NPU controller 130 may control the neural processing unit 100 according to a determined processing order of the neural processing unit 100 based on the data locality information or the information about the structure of the artificial neural network model.

Moreover, the scheduler in the NPU controller 130 may operate the neural processing unit 100 according to the determined the processing order based on the data locality information or the information about the structure of the artificial neural network model and/or data locality information or information about a structure of the neural processing unit 100 to be used.

However, the present disclosure is not limited to the data locality information or the information about the structure of the neural processing unit 100.

The scheduler in the NPU controller 130 may be configured to store the data locality information or the information about the structure of the artificial neural network.

That is, even though only the data locality information or the information about the structure of the artificial neural network of the artificial neural network model is utilized, the scheduler in the NPU controller 130 may determine a processing sequence.

Moreover, the scheduler in NPU controller 130 may determine the processing order of the neural processing unit 100 by considering the data locality information or the information about the structure of the artificial neural network model and data locality information or information about a structure of the neural processing unit 100. Furthermore, it is possible to optimize the processing according to the determined processing order.

That is, the NPU controller 130 may be configured to operate based on machine code compiled by a compiler, but in another example, the NPU controller 130 may be configured to embed an embedded compiler. According to the above-described configuration, the neural processing unit 100 may be configured to receive a file in the form of a framework of various AI software and generate machine code. For example, AI software frameworks may include TensorFlow, PyTorch, Keras, XGBoost, mxnet, DARKNET, ONNX, and the like.

The plurality of processing elements 110 refers to a configuration in which a plurality of processing elements PE1 to PE12 that is configured to operate feature map and weight data of the artificial neural network is deployed. Each processing element may include a multiply and accumulate (MAC) operator and/or an arithmetic logic unit (ALU) operator, but the examples according to the present disclosure are not limited thereto.

Each processing element may further include an additional special function unit for processing the additional special functions.

For example, it is also possible for the processing element PE to be modified and implemented to further include a batch-normalization unit, an activation function unit, an interpolation unit, and the like.

The SFU 150 may include each processing circuit configured to select and process activation function operation, pooling operation, stride operation, batch-normalization operation, skip-connection operation, concatenation operation, quantization operation, clipping operation, padding operation, and the like according to the architecture of the artificial neural network. That is, the SFU 150 may include a plurality of special function arithmetic processing circuit units.

Even though FIG. 3 illustrates a plurality of processing elements as an example, operators implemented by a plurality of multiplier and adder trees may also be configured to be deployed in parallel in one processing element, instead of the MAC. In this case, the plurality of processing elements 110 may also be referred to as at least one processing element including a plurality of operators.

The plurality of processing elements 110 is configured to include a plurality of processing elements PE1 to PE12. The plurality of processing elements PE1 to PE12 of FIG. 3 is merely an example for the convenience of description and the number of the plurality of processing elements PE1 to PE12 is not limited to 12 or any other integer numbers. A size or the number of processing element arrays 110 may be determined by the number of the plurality of processing elements PE1 to PE12. The size of the plurality of processing elements 110 may be implemented by an N×M matrix. Here, N and M are integers greater than zero. The plurality of processing elements 110 may include N×M processing elements. That is, one or more processing elements may be provided.

A number of the plurality of processing elements 110 may be designed in consideration of the characteristic of the artificial neural network model in which the neural processing unit 100 operates.

The plurality of processing elements 110 is configured to perform a function such as addition, multiplication, and accumulation required for the artificial neural network operation. In other words, the plurality of processing elements 110 may be configured to perform a multiplication and accumulation (MAC) operation.

Hereinafter, a first processing element PE1 among the plurality of processing elements 110 will be explained with an example.

Figure 4A:
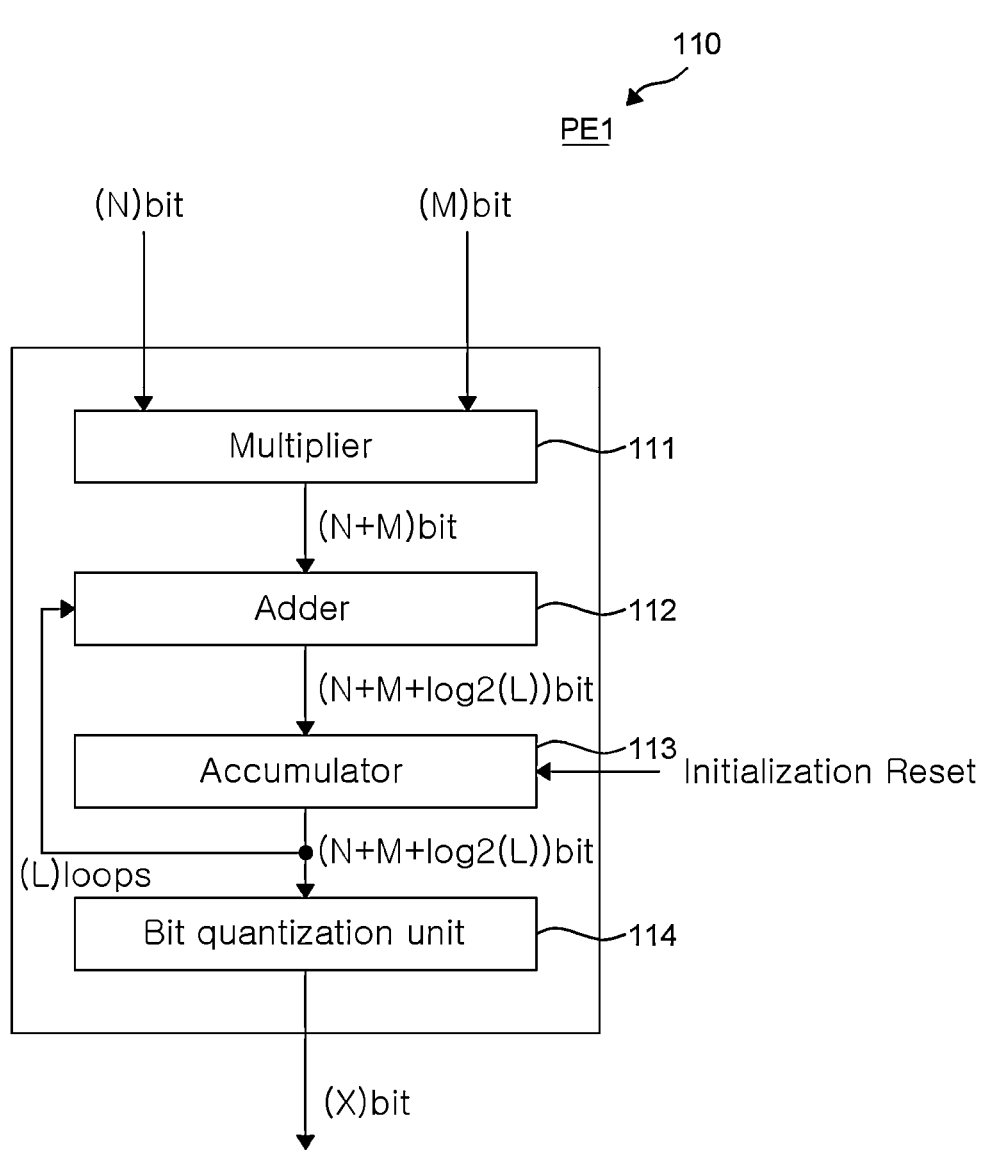
FIG. 4A is a schematic diagram illustrating a processing element of one of a plurality of processing elements that may be applicable to one example of the present disclosure.

FIG. 4A illustrates one processing element among a plurality of processing elements that may be applied to an example of the present disclosure.

As illustrated in FIG. 3, the neural processing unit 100 according to the examples of the present disclosure may include the plurality of processing elements 110, the NPU internal memory 120 configured to store an artificial neural network model inferred from the plurality of processing elements 110, and the NPU controller 130 configured to control the plurality of processing elements 110 and the NPU internal memory 120 based on data locality information or information about a structure of the artificial neural network model. The plurality of processing elements 110 is configured to perform the MAC operation and the plurality of processing elements 110 is configured to quantize and output the MAC operation result, but the examples of the present disclosure are not limited thereto.

The NPU internal memory 120 may store all or a part of the artificial neural network model in accordance with the memory size and the data size of the artificial neural network model.

As illustrated in FIG. 4A, the first processing element PE1 may include a multiplier 111, an adder 112, an accumulator 113, and a bit quantizer 114. However, the examples according to the present disclosure are not limited thereto and the plurality of processing elements 110 may be modified in consideration of the operation characteristic of the artificial neural network.

The multiplier 111 multiplies input (N) bit data and (M) bit data. The operation value of the multiplier 111 is output as (N+M) bit data.

The multiplier 111 may be configured to receive one variable and one constant.

The accumulator 113 accumulates an operation value of the multiplier 111 and an operation value of the accumulator 113 using the adder 112 as many times as the number of (L) loops. Therefore, a bit width of data of an output unit and an input unit of the accumulator 113 may be output to (N+M+ log 2(L)) bits. Here, L is an integer greater than zero.

When the accumulation is completed, the accumulator 113 is applied with an initialization reset to initialize the data stored in the accumulator 113 to zero, but the examples according to the present disclosure are not limited thereto.

The bit quantizer 114 may reduce the bit width of the data output from the accumulator 113. The bit quantizer 114 may be controlled by the NPU controller 130. The bit width of the quantized data may be output to (X) bits. Here, X is an integer greater than zero. According to the above-described configuration, the plurality of processing elements 110 is configured to perform the MAC operation and the plurality of processing elements 110 may quantize the MAC operation result to output the result. The quantization may have an effect that the larger the (L) loops, the smaller the power consumption. Further, when the power consumption is reduced, the heat generation may also be reduced. Additionally, when the heat generation is reduced, the possibility of the erroneous operation of the neural processing unit 100 due to the high temperature may be reduced.

Output data (X) bits of the bit quantizer 114 may serve as node data of a subsequent layer or input data of a convolution. When the artificial neural network model is quantized, the bit quantizer 114 may be configured to be supplied with quantized information from the artificial neural network model. However, it is not limited thereto and the NPU controller 130 may also be configured to extract quantized information by analyzing the artificial neural network model. Accordingly, the output data (X) bit is converted to a quantized bit width to be output so as to correspond to the quantized data size. The output data (X) bit of the bit quantizer 114 may be stored in the NPU internal memory 120 with a quantized bit width.

The plurality of processing elements 110 of the neural processing unit 100 according to an example of the present disclosure may include a multiplier 111, an adder 112, and an accumulator 113. The bit quantizer 114 may be selected according to whether quantization is applied or not. In another example, the bit quantization unit may also be configured to be included in the SFU 150.

Figure 4B:
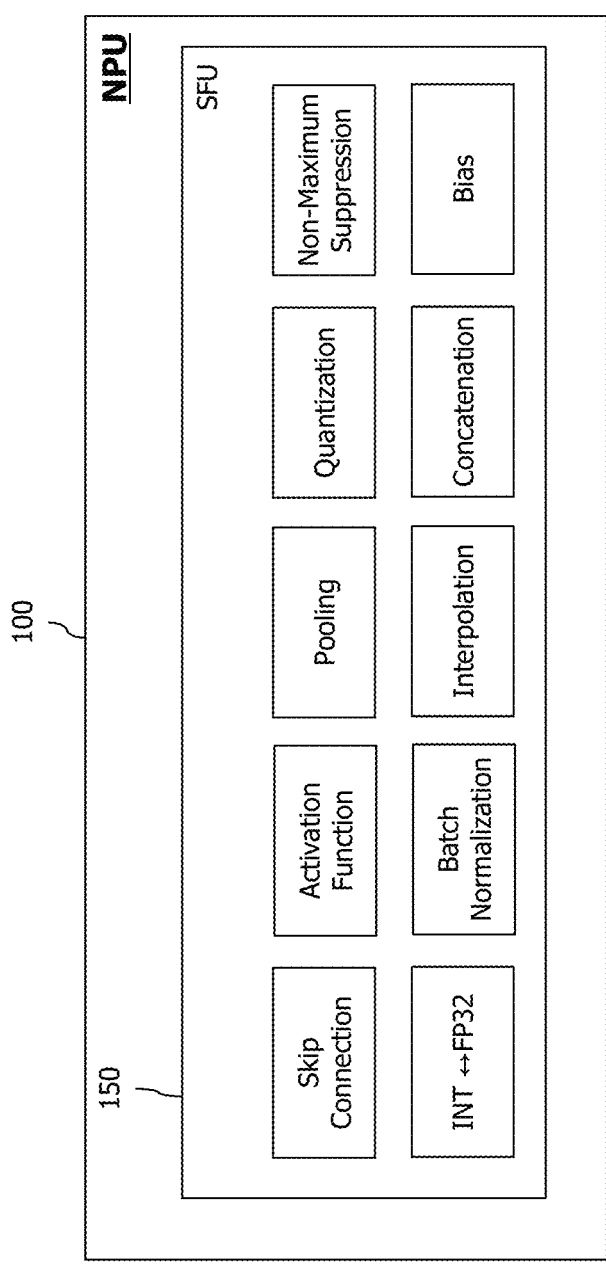
FIG. 4B is a schematic diagram illustrating an SFU that may be applicable to one example of the present disclosure.

FIG. 4B is a schematic conceptual diagram illustrating an SFU that can be applied to an example of the present disclosure.

Referring to FIG. 4B, the SFU 150 may include several functional units. Each functional unit can be operated selectively. Each functional unit can be selectively turned on or turned off. That is, each functional unit can be set.

In other words, the SFU 150 may include various circuit units required for an artificial neural network inference operation.

For example, the circuit units of the SFU 150 may include a functional unit for skip-connection operation, a functional unit for activation function operation, a functional unit for pooling operation, a functional unit for quantization operation, a functional unit for non-maximum suppression (NMS) operation, a functional unit for integer to floating point conversion (INT to FP32) operation, a functional unit for a batch-normalization operation, a functional unit for an inter-polation operation, a functional unit for a concatenation operation, a functional unit for a bias operation, and the like.

Functional units of the SFU 150 may be selectively turned on or off according to the data locality information of the artificial neural network model. Data locality information of an artificial neural network model may include turn-off of a corresponding functional unit or control information related to turn-off when an operation for a specific layer is performed.

An activated unit among functional units of the SFU 150 may be turned on. In this way, when some functional units of the SFU 150 are selectively turned off, power consumption of the neural processing unit 100 can be reduced. Meanwhile, in order to turn off some functional units, power gating may be used. Alternatively, clock gating may be performed to turn off some functional units.

Figure 5:
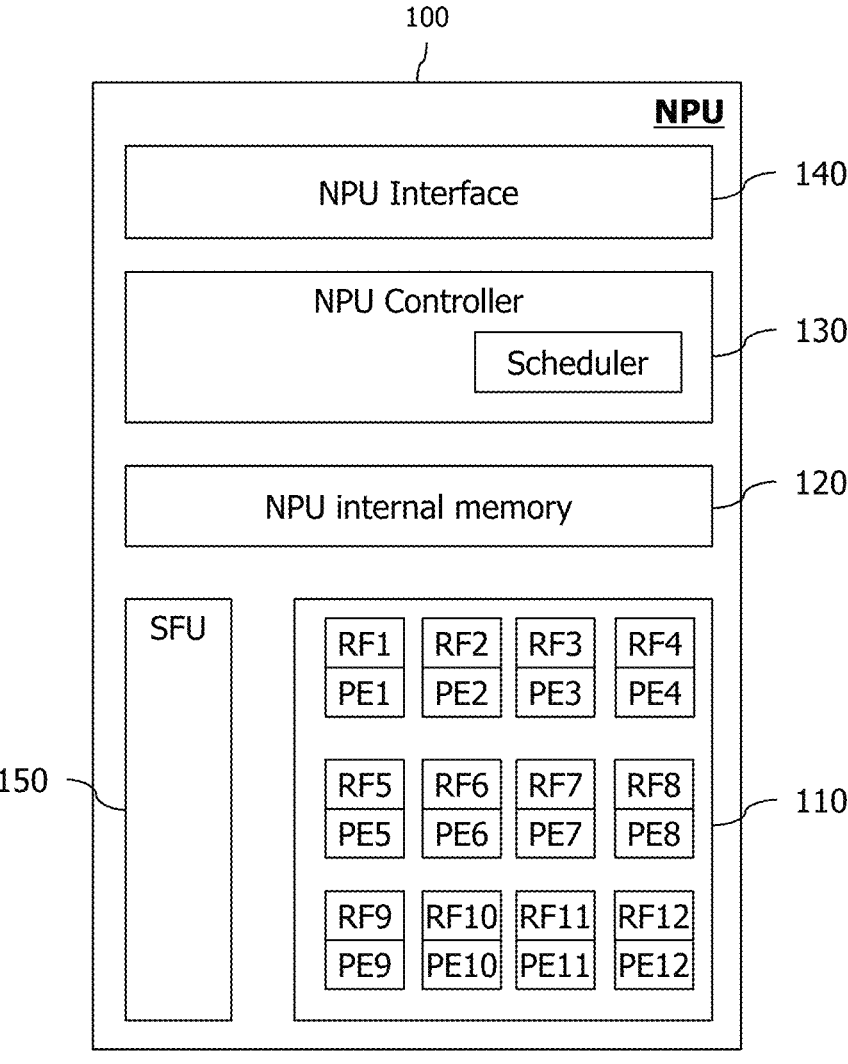
FIG. 5 is an exemplary diagram illustrating a variation of the neural processing unit 100 shown in FIG. 3.

FIG. 5 illustrates a modified example of the neural processing unit 100 of FIG. 3.

The neural processing unit 100 of FIG. 5 is substantially the same as the neural processing unit 100 exemplarily illustrated in FIG. 3, except for the shown addition of the plurality of processing elements 110. Thus, redundant description will be omitted for the brevity.

The plurality of processing elements 110 exemplarily illustrated in FIG. 5 may further include register files RF1 to RF12, each of which corresponds to processing elements PE1 to PE12 respectively, in addition to a plurality of processing elements PE1 to PE12.

The plurality of processing elements PE1 to PE12 and the plurality of register files RF1 to RF12 of FIG. 5 are merely an example for the convenience of description and the number of the plurality of processing elements PE1 to PE12 and the plurality of register files RF1 to RF12 is not limited to 12 or any other integer number.

A size of, or the number of, processing element arrays 110 may be determined by the number of the plurality of processing elements PE1 to PE12 and the plurality of register files RF1 to RF12. The size of the plurality of processing elements 110 and the plurality of register files RF1 to RF12 may be implemented by an N×M matrix. Here, N and M are integers greater than zero.

An array size of the plurality of processing elements 110 may be designed in consideration of the characteristic of the artificial neural network model in which the neural processing unit 100 operates. For additional explanation, the memory size of the register file may be determined in consideration of a data size, a required operating speed, and a required power consumption of the artificial neural network model to operate.

The register files RF1 to RF12 of the neural processing unit 100 are static memory units which are directly connected to the processing elements PE1 to PE12. For example, the register files RF1 to RF12 may be configured by flip-flops and/or latches. The register files RF1 to RF12 may be configured to store the MAC operation value of the corresponding processing elements PE1 to PE12. The register files RF1 to RF12 may be configured to provide or be provided with the weight data and/or node data to or from the NPU internal memory 120.

It is also possible that the register files RF1 to RF12 are configured to perform a function of a temporary memory of the accumulator during MAC operation.

<Semiconductor Testing for High Reliability>

Although a single NPU semiconductor is described herein, the present disclosure is not limited thereto, and the present disclosure may also be applied to a system in package (SiP) or printed circuit board (PCB) based board level system. For example, each functional component may be implemented as an independent semiconductor chip, and may be interconnected via a system bus implemented by electrically conductive patterns formed on a PCB.

Figure 6A:
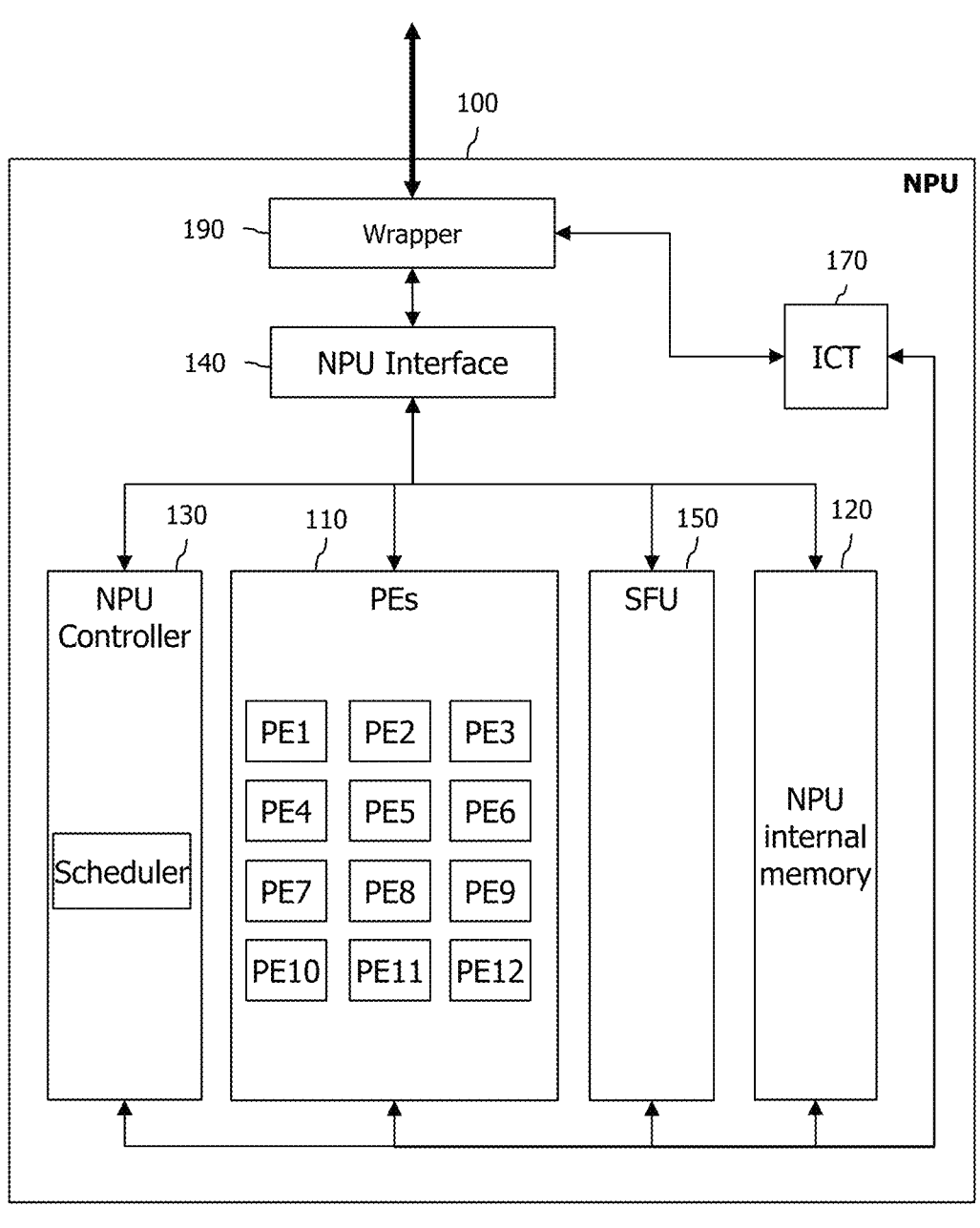
FIG. 6A is a block diagram illustrating a configuration of an NPU with testing capabilities, according to a first example.

FIG. 6A is a block diagram showing the configuration of an NPU with a test function according to the first example.

Referring to FIG. 6A, the exemplary NPU 100 may include a plurality of functional components, an In-system Component Tester (ICT) 170, and at least one wrapper 190.

A wrapper can adapt the interfaces of components that communicate with each other. Accordingly, the wrapper may also be referred to as an interface circuit.

The plurality of functional components may include a plurality of processing elements 110, an internal memory 120, a NPU controller 130, an interface 140, and a SFU 150.

The interface 140 may be referred to as a bus interface unit (BIU).

The NPU controller 130 may include a scheduler.

The examples of the present disclosure are not limited thereto, and at least some of the plurality of functional components may be removed. The examples of the present disclosure are not limited thereto and may further include other functional components other than the plurality of functional components described above.

The plurality of processing elements 110 may be connected to the NPU controller 130 through an interface 140. Similarly, the memory 120 may be connected to the NPU controller 130 through the interface 140. Additionally, the SFU 150 may also be connected to the NPU controller 130 via the interface 140.

However, depending on the design, the plurality of processing elements 110 may be directly connected to the NPU controller 130. Similarly, the memory 120 may also be directly connected to the NPU controller 130. Additionally, the SFU 150 may also be directly connected to the NPU controller 130. Optionally, the plurality of processing elements 110 may also be directly connected to the SFU 150. Further, the NPU internal memory 120 may also be directly connected to the SFU 150.

The interface 140 is monitored by the wrapper 190. Specifically, signals transmitted and received over the interface 140 may be monitored by the wrapper 190. Additionally, the wrapper 190 may monitor accesses by the NPU controller 130 to other functional components via the interface 140. Specifically, the wrapper 190 may monitor that the NPU controller 130 controls the plurality of processing elements 110 through the interface 140. Also, the wrapper 190 may monitor that the NPU controller 130 controls the memory 120 through the interface 140. Further, the wrapper 190 may monitor a plurality of functional components via the interface 140. For example, the wrapper 190 may monitor the behavior or status of the plurality of processing elements 110 via the interface 140. Further, the wrapper 190 may monitor the behavior or status of the NPU internal memory 120 via the interface 140. Further, the wrapper 190 may monitor the behavior or status of the SFU 150 via the interface 140.

The ICT 170 may be connected to the wrapper 190 through a dedicated signal channel. Further, the wrapper 190 may monitor a plurality of functional components via the interface 140. For example, the wrapper 190 may monitor the behavior or status of the plurality of processing elements 110 via the interface 140. Further, the wrapper 190 may monitor the behavior or status of the NPU internal memory 120 via the interface 140. Further, the wrapper 190 may monitor the behavior or status of the SFU 150 via the interface 140.

The wrapper 190 may be coupled to the interface 140 through a dedicated signal channel. Also, the wrapper 190 may be connected to each functional component through the interface 140.

The ICT 170 may directly monitor the NPU controller 130 or monitor the states of the plurality of functional components through the wrapper 190. Each functional component may be in an idle state or a busy state.

When an idle functional component is found, the ICT 170 may select the corresponding functional component as a component under test (CUT). Depending on the circumstances, the ICT 170 may also select non-idle functional components as CUTs.

If a plurality of functional components is in an idle state, the ICT 170 may select any one functional component as the CUT according to a preset rule.

If a plurality of functional components is in an idle state, the ICT 170 may randomly select any one functional component as a CUT. By doing this, the ICT 170 may cut off the connection between the functional component selected as the CUT and the interface 140 or isolate from the interface 140. To this end, the ICT 170 may instruct the wrapper 190 to cut off or isolate the functional component from the interface 140. To be more specific, the ICT 170 cuts off the connection between the functional component selected as the CUT and the interface 140 by means of the wrapper 190 and then may instruct the wrapper 190 to transmit a signal to the interface 140, instead of the functional component selected as the CUT.

At this time, the signal which is transmitted to the interface 140 may be a signal which is transmitted to the interface 140 when the functional component selected as the CUT is in an idle state. To this end, when the functional component selected as the CUT is in an idle state, the wrapper 190 may monitor (or overhear) and store the signal which is transmitted to the interface 140. The corresponding wrapper 190 regenerates the stored signal to transmit the regenerated signal to the interface 140. In the meantime, the corresponding wrapper 190 may detect a signal from the interface 140.

Thereafter, the ICT 170 may test the functional component selected as the CUT.

Specifically, the rule may include one or more of a priority rule according to the mission to be performed, a rule for priority between functional components, a rule according to the presence or absence of a spare for the corresponding functional component, a rule defined by the number of tests, and a rule defined by a previous test result.

When a collision occurs due to access from the interface 140 to a functional component selected as the CUT at the time of starting the test or during the test, the ICT 170 may detect the collision.

If so, the ICT 170 may stop (interrupt) the test and drive a back-off timer with respect to the collision.

The ICT 170 may reinstate the connection of the functional component selected as the CUT to the interface 140.

In the meantime, when the back-off time of the back-off timer for the conflict expires, the ICT 170 may monitor whether the functional components enter the idle state again. If the functional component enters the idle state again, the ICT 170 may select the functional component as a CUT again.

If the conflict is not detected, the ICT 170 may continue the test and when the test is completed, analyze the test result.

The test may be for verifying whether a component of the system is defective in its manufacture, has been compromised, or has broken down. The compromising or the breakdown may be caused by a fatigue stress due to repeated usage or a physical stress such as heat or electromagnetic pulse (EMP). That is, it may be configured to detect a defect based on the test result.

It will be described that the test is performed on the plurality of processing elements 110. As it will be described below, there are two types of tests including a function test and a scan test.

First, when the function test is performed on the plurality of processing elements 110, the ICT 170 may input a predetermined ANN test model and a test input to the plurality of processing elements 110. When the plurality of processing elements 110 outputs an inference result for the test input using the input ANN test model, the ICT 170 compares an intended inference result and the inference result from the plurality of processing elements 110 to analyze whether the plurality of processing elements 110 is normal or defective. For example, when the ANN test model is a predetermined CNN and the test input is a simple test image, the plurality of processing elements 110 performs the convolution and the pooling on the test image using the ANN test model to output a fully connected layer. Then, the ICT 170 compares the inference results derived from the output of the fully connected layer with the pre-stored inference answers for the test image, and determines whether they match. Thus, functional testing may mean determining whether the NPU outputs the intended results using the ANN test model and test inputs.

Next, when the scan test is performed on the plurality of processing elements 110, as it will be described below, the ICT 170 may thread the flip-flops in the plurality of processing elements 110 with a scan chain. The ICT 170 may inject the test input to at least one flip-flop and acquire a test result from an operation of a combinational logic of the flip-flop to analyze whether the plurality of processing elements 110 is defective or normal during the runtime.

The test performed by the ICT 170 may be a test performed to determine a fair quality before the NPU semiconductor which is mass-produced in the factory comes out.

According to the present disclosure, it is noted that the test for determining a fair quality may also be performed during the runtime of the NPU.

That is, according to a known art, a test for determining a fair quality is possible only before the NPU semiconductor comes out from the factory.

The present disclosure has the advantage of identifying and sequentially testing idle functional components among multiple functional components in an NPU, thereby enabling sufficient quality testing even for a running NPU.

As a test analysis result, when the corresponding functional component is determined as normal, the ICT 170 returns back the connection with the functional component to the interface 140. Specifically, the ICT 170 may allow the connection between the functional component and the interface 140. To be more specific, the ICT 170 may initialize the functional component to be connected to the interface 140 and then instruct the wrapper 190 to stop a signal which is transmitted to the interface 140.

However, if the test analysis result is determined as defective, the ICT 170 may repeat the test several times.

When as a result of several times repeated tests, the functional component is determined as defective, that is, when it is determined that the functional component in the NPU is defective in its manufacture, has been compromised, or has broken down, the ICT 170 may deactivate the functional component.

As an alternative, when an error code included in a one-time test analysis result indicates that the functional component in the NPU is defective in its manufacture, has been compromised, or has broken down, the ICT 170 may deactivate the functional component.

In order to disable the abnormal functional component, the ICT 170 may isolate the abnormal functional component from the interface 140, or may cut-off or disconnect or disconnect the connection of the abnormal functional component. Alternatively, in order to deactivate the defective functional component, the ICT 170 may power off (turn off) the functional component. When the functional component is powered off, the erroneous operation of the defective functional component is prevented and the power consumption may be reduced.

Further, in order to deactivate the defective functional component, the ICT 170 may revoke the address of the functional component on the interface 140 or transmit a signal for deleting to the interface 140. That is, the ICT 170 may transmit a signal for deleting an address of the defective functional component to a component having addresses used on the interface 140.

In the meantime, when the deactivation is completed, the ICT 170 may determine whether there is a spare for the functional component.

That is, various examples of the present disclosure may be configured to include at least one spare component corresponding to at least one functional component.

That is, various examples of the present disclosure may be configured to include each spare component corresponding to each of a plurality of functional components.

Even though a spare may exist, when the spare is not in an active state, the ICT 170 may activate the spare. That is, the ICT 170 may transmit a signal including a request for updating an address of the activated spare in a table to a component having the table of addresses used on the interface 140.

When an address on the interface 140 is not allocated to the spare in the deactivated state, the ICT 170 may transmit a signal for reallocating an address of the defective functional component to the spare to the interface 140.

After monitoring whether the spare is in an idle state, the ICT 170 may perform the test.

While the ICT 170 is shown in FIG. 6A as being included within the NPU 100, it can also be disposed outside of the NPU 100, as will be described later. This will be described with reference to FIG. 6B.

Figure 6B:
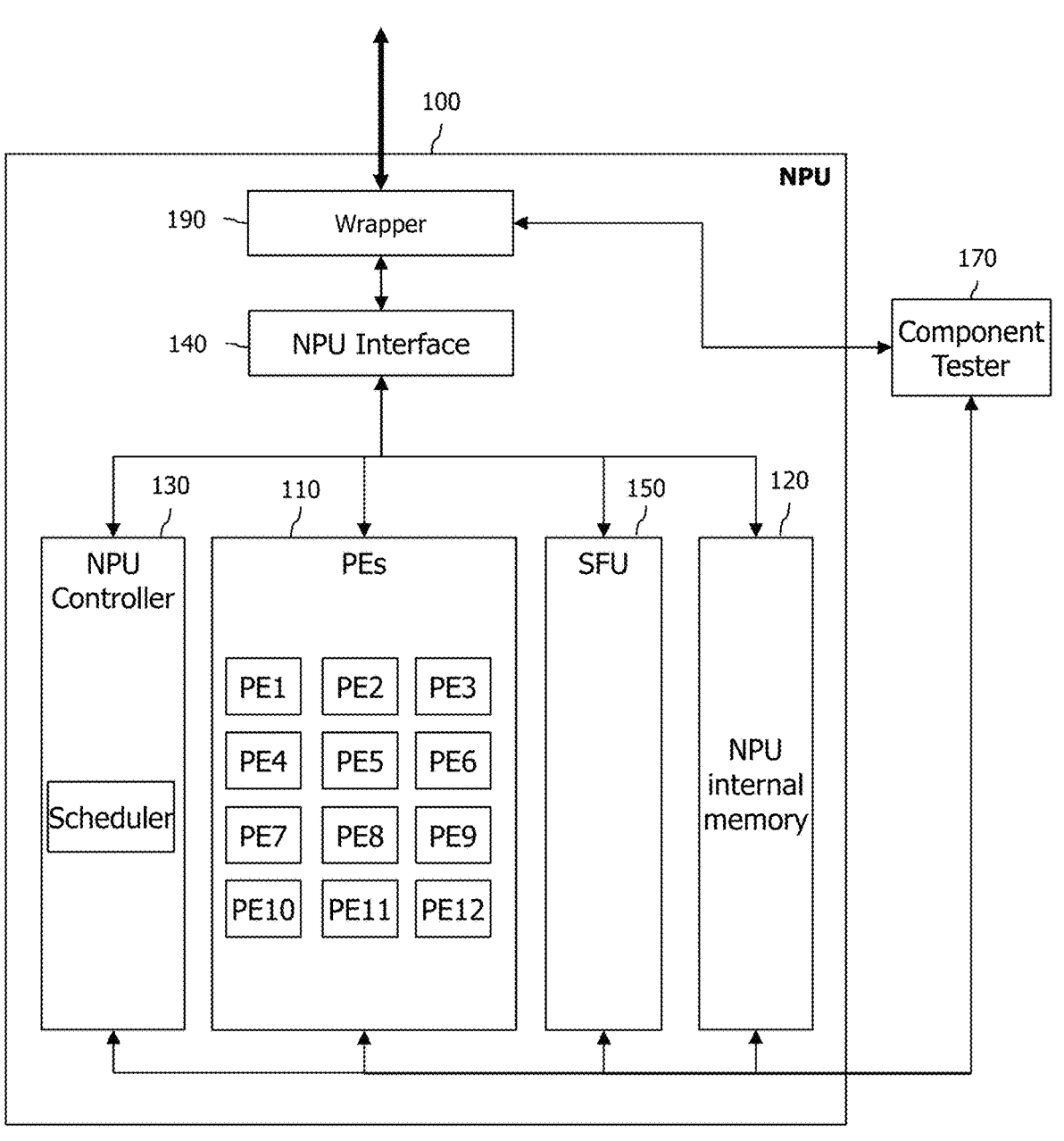
FIG. 6B is an exemplary diagram illustrating a variant of the first example shown in FIG. 6A.

FIG. 6B is a block diagram showing the configuration of an NPU with a test function according to the second example.

As shown in FIG. 6B, the component tester 170 may be located outside of the NPU 100. In this case, the component tester 170 may be referred to as an out-system component tester (OCT) rather than an ICT. The component tester 170 shown in FIG. 6B may select at least one of the plurality of functional components as a CUT via the wrapper 190 to perform testing. In some circumstances, the component tester 170 may also select non-idle functional components as CUTs to perform testing.

Figure 6C:
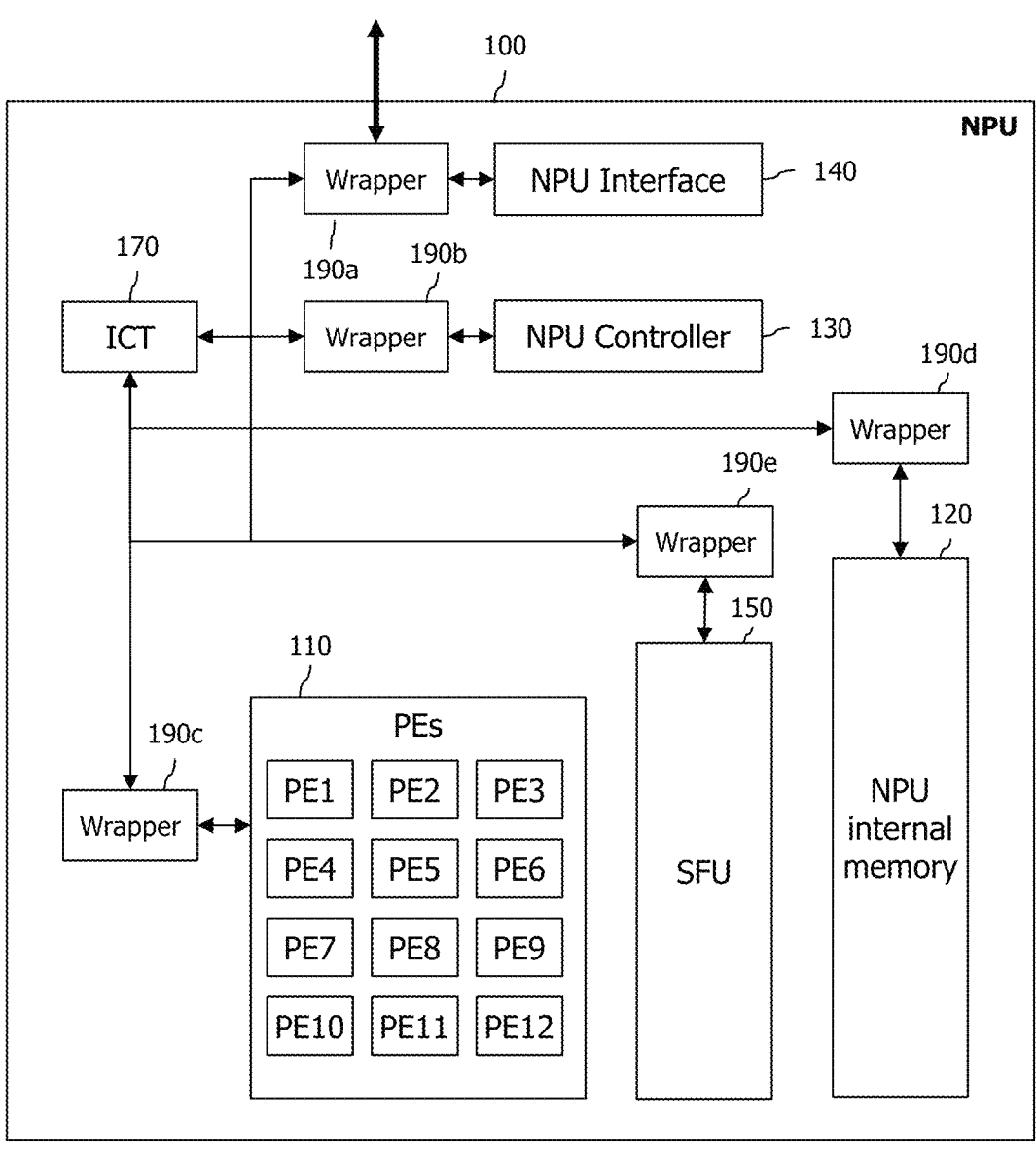
FIG. 6C is a block diagram illustrating a configuration of an NPU with test capabilities, according to a second example.

FIG. 6C is a block diagram illustrating a configuration of an NPU with test capabilities, according to a second example.

Referring to FIG. 6C, the exemplary NPU 100 may include a plurality of functional components, an in-system component tester (ICT) 170, and a plurality of wrappers 190a, 190b, . . . (which may be collectively denoted 190).

The wrapper 190 may adapt the interfaces of components that communicate with each other. Accordingly, the wrapper may also be referred to as an interface circuit.

The plurality of wrappers 190 may be directly connected to each other. Depending on the design, the plurality of wrappers 190 may be isolated from each other by the ICT 170 and connected to each other only through the ICT 170.

The plurality of functional components may include a plurality of processing elements 110, a memory 120, a NPU controller 130, an NPU interface 140, and SFU 150.

The plurality of functional components may be coupled to each other via one or more wrappers 190.

The interface 140 may be referred to as a Bus Interface Unit (BIU). The interface 140 may be responsible for communication with an electronic or semiconductor device disposed outside the NPU, such as a main memory, or a central processing unit (CPU).

The plurality of processing elements 110 may be connected to the NPU controller 130 through at least one wrapper 190. Similarly, the memory 120 may be connected to the NPU controller 130 through at least one wrapper 190.

The ICT 170 may monitor and control each functional component through at least one wrapper 190. For example, the ICT 170 may monitor and control the access of the NPU controller 130 to the plurality of processing elements 110 through the wrapper 190b and the wrapper 190c. In addition, the ICT 170 may monitor and control access to the memory 120 by the NPU controller 130 through the wrapper 190b and the wrapper 190d. Similarly, the ICT 170 may monitor and control access of the plurality of processing elements 110 to the memory 120 through the wrapper 190c and the wrapper 190d.

The ICT 170 may be connected to each wrapper 190 through a dedicated signal channel.

The ICT 170 monitors the plurality of processing elements 110 through the wrapper 190c, monitors the memory 120 through the wrapper 190d, or the NPU controller 130 through the wrapper 190b. By monitoring, it is possible to monitor whether each of the plurality of processing elements 110, the memory 120, and the NPU controller 130 is in an idle state or a busy state.

When an idle functional component is found, the ICT 170 may select the corresponding functional component as a component under test (CUT).

If a plurality of functional components is in an idle state, the ICT 170 may select any one functional component as the CUT according to a preset rule.

If a plurality of functional components is in an idle state, the ICT 170 may randomly select any one functional component as the CUT. Then, the ICT 170 may block or isolate the connection of the functional component selected as the CUT. To this end, the ICT 170 may instruct the wrapper 190 to block or isolate the corresponding functional component.

More specifically, after the ICT 170 may block the connection with the functional component selected as the CUT through the wrapper 190, the wrapper 190 instructs the corresponding wrapper 190 to imitate and transmit a necessary signal on behalf of the functional component selected as the CUT. In this case, the transmitted signal may be a signal transmitted when the functional component selected as the CUT is in an idle state. To this end, the wrapper 190 may monitor (or overhear) and store a transmitted signal when the functional component selected as the CUT is in the idle state. Then, the wrapper 190 may regenerate the stored signal and transmit it.

Thereafter, the ICT 170 may perform a test on the functional component selected as the CUT. This is similar to the content described with reference to FIG. 6A, and thus redundant descriptions will not be described.

When a collision occurs due to access to the functional component selected as the CUT at the time of starting the test or during the test, the ICT 170 may detect the collision.

Then, the ICT 170 may stop the test and drive a back-off timer for the collision.

Then, the ICT 170 may return the functional component selected to the CUT.

Meanwhile, when the back-off timer for the collision expires, the ICT 170 may monitor whether the corresponding functional component enters the idle state again. If the corresponding functional component enters the idle state again, the ICT 170 may select the corresponding functional component as the CUT again.

If the collision is not detected, the ICT 170 may continue the test and, when the test is completed, analyze the test result.

Since other detailed descriptions are similar to those described with reference to FIG. 6A, redundant descriptions will not be repeated, and the contents described with reference to FIG. 6A will be cited.

In FIG. 6C, the ICT 170 is shown as being contained within the NPU 100, but may also be disposed outside of the NPU 100, as will be described later. This will be described with reference to FIG. 6D.

Figure 6D:
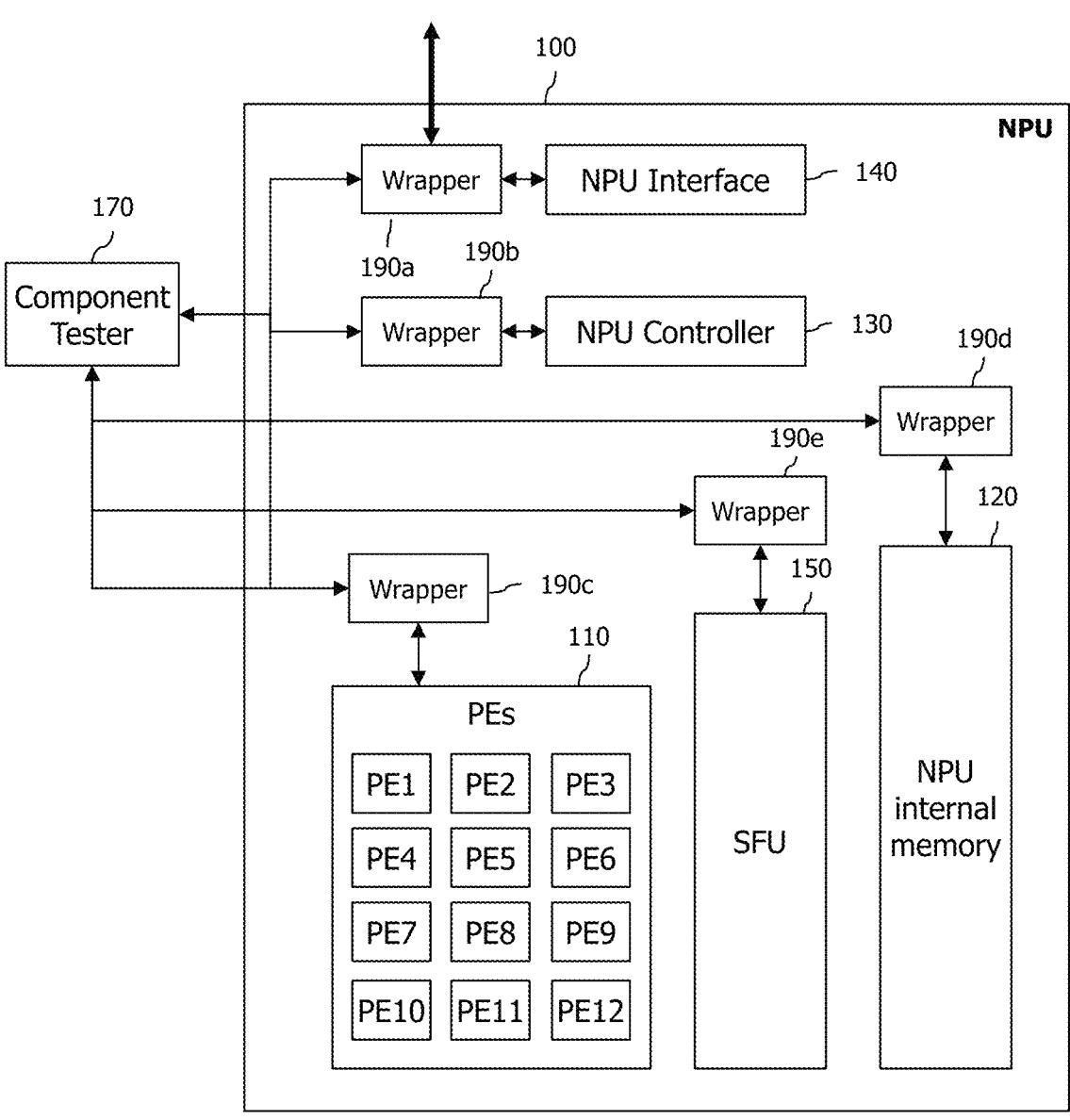
FIG. 6D is an exemplary diagram illustrating a variant of the second example shown in FIG. 6C.

FIG. 6D is an exemplary diagram illustrating a variant of the second example shown in FIG. 6C.

As shown in FIG. 6D, the component tester 170 may be located outside of the NPU 100. In this case, the component tester 170 may be referred to as an out-system component tester (OCT) rather than an ICT. The component tester 170 shown in FIG. 6D may select at least one of the plurality of functional components as a CUT through the wrapper 190 to perform testing. In some circumstances, the component tester 170 may also select non-idle functional components as CUTs to perform testing.

Figure 7A:
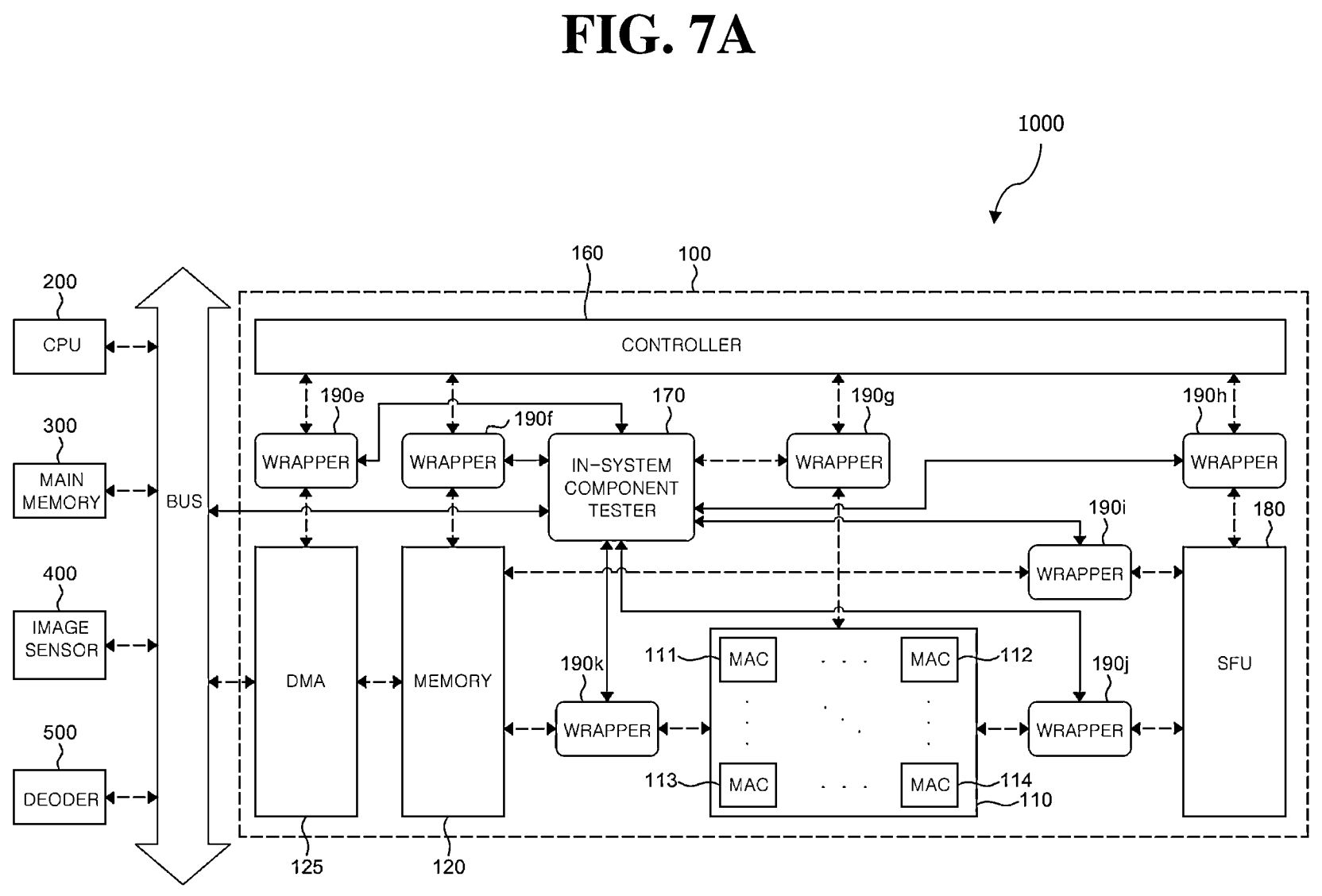

FIG. 7A is a block diagram illustrating a first example configuration of an SoC.

Referring to FIG. 7A, an exemplary SoC 1000 may include an NPU 100, a central processing unit (CPU) 200, a main memory 300, and a system bus. Additionally, the exemplary SoC 1000 may further include an image sensor 400. Further, the SoC 1000 may further include a decoder 500.

The NPU 100 may be coupled to the CPU 200 and to the main memory 300 via the system bus. Additionally, the NPU 100 may be coupled to an image sensor 400 via the system bus. Additionally, the NPU 100 may further be coupled to a decoder 500 via the system bus.

The exemplary NPU 100 shown in FIG. 7A may include a plurality of functional components, an in-system component tester (ICT) 170, and a plurality of wrappers 190e, 190f, . . . 190k (which may be collectively denoted 190).

The plurality of functional components may include a plurality of processing elements 110, an internal memory 120, a direct memory access (DMA) 125, an NPU controller 130, and an SFU 180.

The NPU controller 130 may include an NPU controller 130 as shown in FIG. 6A.

Further, the NPU controller 130 may also include an interface 140 as shown in FIG. 6B, i.e., the NPU controller 130 may include both an NPU controller 130 and an interface 140. A description of the operation of the NPU controller 130 and the interface 140 will follow the foregoing.

The DMA 125 controls access to the memory 120. To this end, the DMA 125 may manage a physical address of the memory 120.

The plurality of processing elements 110 may include a multiplier 111, adder 112, accumulator 113, and bit quantizer 114. Each PE may include a multiply-accumulate (MAC) operator.

A wrapper may be disposed between each functional component and the NPU controller 130. For example, a wrapper 190g may be disposed between the plurality of processing elements 110 and the NPU controller 130. A wrapper 190f may be disposed between the memory 120 and the NPU controller 130. A wrapper 190e may be disposed between the DMA 125 and the NPU controller 130. A wrapper 190h may be disposed between the SFU 180 and the NPU controller 130.

Further, a wrapper 190k may be disposed between the plurality of processing elements 110 and the memory 120. A wrapper 190k may be disposed between the plurality of processing elements 110 and the SFU 180.

Through the plurality of wrappers 190, the ICT 170 may monitor and control each functional component. For example, the ICT 170 may monitor and control interactions between the processing elements 110 and the memory 120 via the wrappers 190k. Additionally, the ICT 170 may monitor and control the memory 120 via wrapper 190f. Further, the ICT 170 may monitor and control the DMA 125 via the wrapper 190e. Further, the ICT 170 may monitor and control interactions between the NPU controller 130 and the plurality of processing elements 110 via the wrapper 190g. The ICT 170 may also monitor and control the SFU 180 via the wrapper 190i. Further, the ICT 170 may monitor and control the interaction of the SFU 180 with the NPU controller 130 via wrapper 190h.

The ICT 170 may be connected to each wrapper 190 via a dedicated signal channel.

The ICT 170 may monitor whether the corresponding functional component is in an idle state or a busy state via each wrapper.

If an idle functional component is found, the ICT 170 may select that functional component as the component under test (CUT).

If a plurality of functional components is idle, the ICT 170 may select any one of the functional components as the CUT according to a preset rule, as described above. As described above, the ICT 170 may disconnect or isolate the functional component selected as the CUT.

Thereafter, the ICT 170 may perform a test on the functional component selected as the CUT. This is similar to that described with reference to FIG. 6A, and will not be described in detail.

If no conflicts are detected, the ICT 170 may continue with the testing as described above, and upon completion of the testing, may analyze the test results.

As described above, if the test analysis results are determined to be abnormal, the ICT 170 may repeat the test a few more times.

If the results of the repeated tests indicate that the functional component is abnormal, i.e., that the functional component is incorrectly manufactured, damaged, or broken within the NPU, the ICT 170 may deactivate the functional component.

If no spare exists for the deactivated functional component, the ICT 170 may cause the SFU 180 to be programmed to mimic the same behavior as the deactivated functional component. For this purpose, the SFU 180 may be implemented as a field programmable gate array (FPGA). Information for programming the SFU 180 may be stored in the internal memory 120. Alternatively, information for programming the SFU 180 may be stored in a cache memory of the SFU 180.

As such, when the SFU 180 is programmed to mimic the same behavior as the disabled functional component, the ICT 170 may transmit a signal comprising a request to update the address table used by the controller 130. Alternatively, it may transmit a signal to the controller 130 comprising a request to cause the address of the abnormal functional component to be reassigned to the SFU 180. In other words, the existing address of the SFU 180 may be revoked and replaced with the address of the abnormal functional component.

In FIG. 7A, the ICT 170 is shown as being contained within the NPU 100, but as described above, it may be disposed outside the NPU 100. In this case, the ICT 170 may be referred to as an out-system component tester (OCT).

Figure 7B:
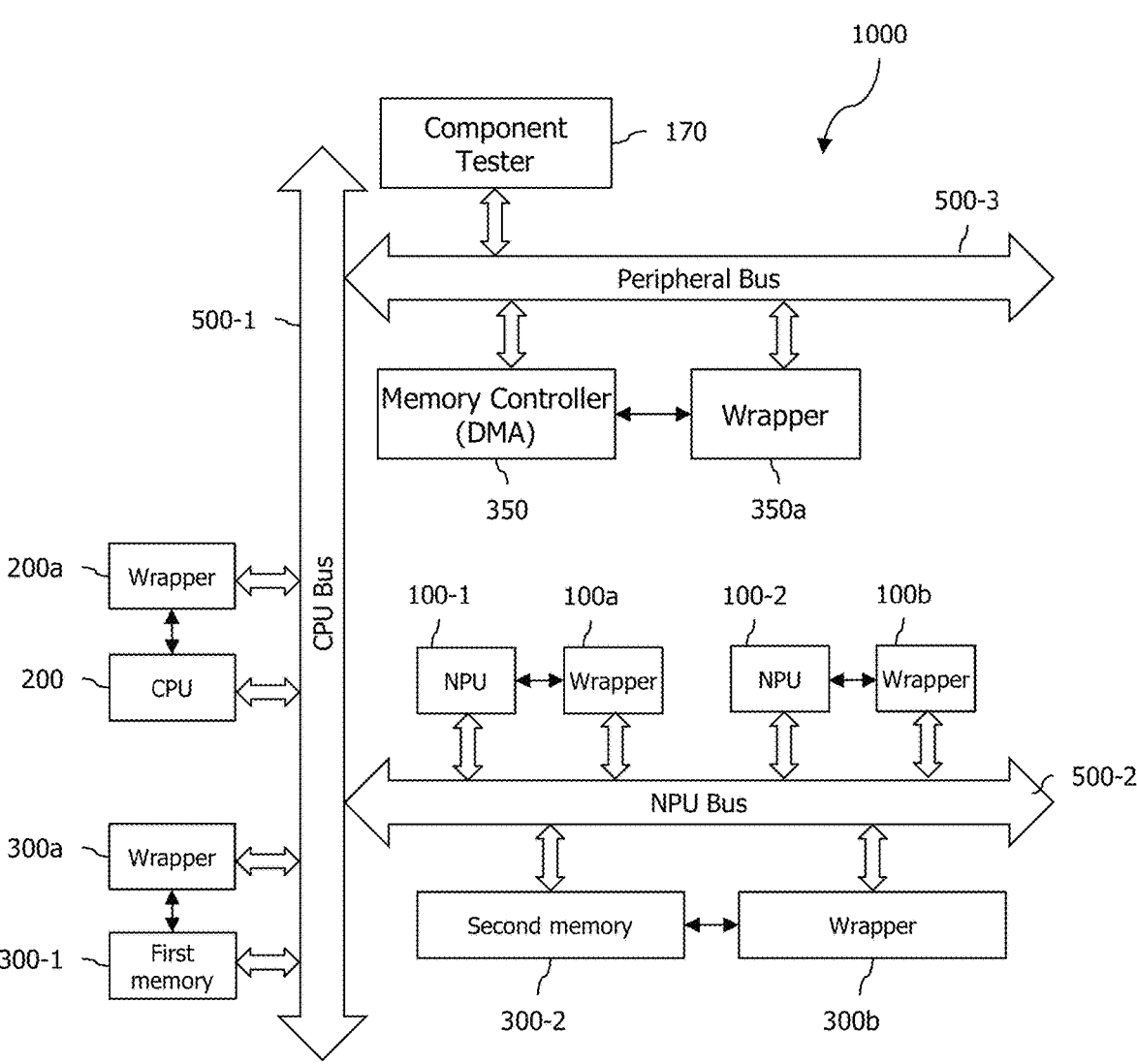
FIG. 7B is a block diagram illustrating a configuration of an SoC in the second example.

FIG. 7B is a block diagram illustrating a second example configuration of an SoC.

Referring to FIG. 7B, the exemplary SoC 1000 may include a plurality of functional components, i.e., the exemplary SoC 1000 may include a plurality of NPUs, a central processing unit (CPU) 200, and a plurality of memories. The plurality of NPUs may include, for example, a first NPU 100-1 and a second NPU 100-2. The plurality of memories may include a first memory 300-1 and a second memory 300-2.

In FIG. 7B, the plurality of NPUs and the plurality of memories are illustrated as having a number of two each, but the number of memories may be varied, such as, but not limited to, four, six, eight, and the like.

The exemplary SoC 1000 may include a memory controller 350 and a plurality of buses.

The plurality of buses may include a bus for a CPU, such as a CPU bus 500-1, a bus for an NPU, such as an NPU bus 500-2, and a bus for neighboring components, such as a peripheral bus 500-3.

The CPU bus 500-1 may be connected the CPU 200 and the first memory 300-1. The NPU bus 500-2 may be connected the first NPU 100-1 and the second NPU 100-2 and the second memory 300-2. The neighboring bus 500-3 may be connected a memory controller 350.

The exemplary SoC 1000 may include a component tester 170 and a plurality of wrappers.

Each wrapper may be connected to each functional component, i.e., a wrapper 100a may be connected to the first NPU 100-1, and a wrapper 100b may be connected to the second NPU 100-2. The CPU 200 may be connected to a wrapper 200a, and the first memory 300-1 may be connected to a wrapper 300a. A second memory 300-2 may be connected to a wrapper 300b. The memory controller 350 may be connected to a wrapper 350a.

Each wrapper may monitor whether its functional component (e.g., NPU, CPU, and the like) is idle. Each of the wrappers may notify the component tester 170 whether the corresponding functional component is idle or in use.

Figure 8:
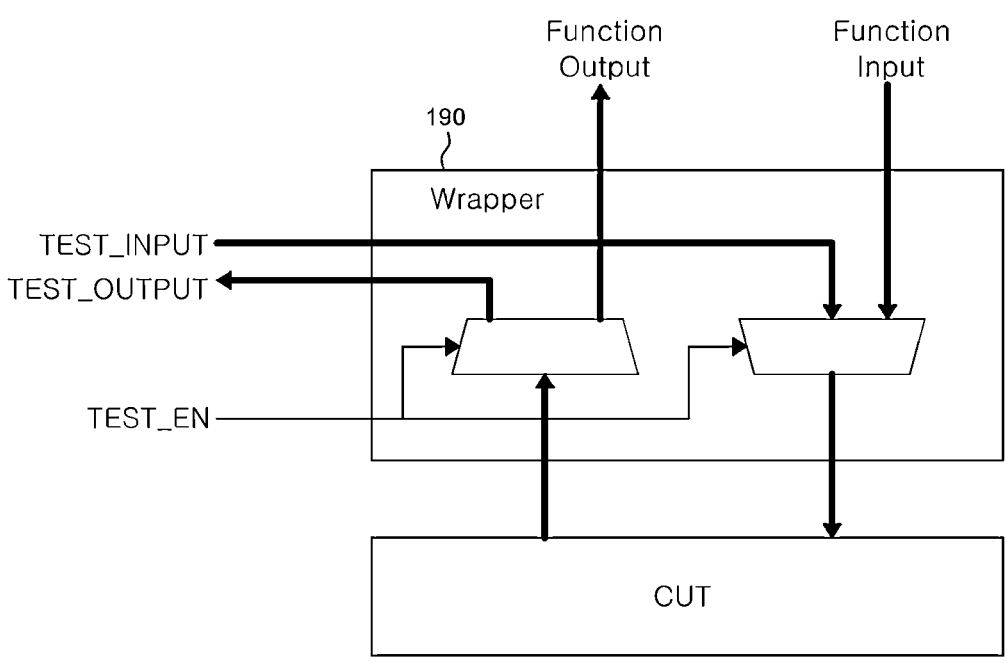
FIG. 8 is an exemplary diagram illustrating an operation of a wrapper.

FIG. 8 is an exemplary diagram illustrating the operation of the wrapper.

As described above, the ICT 170 or component tester 170 may test a plurality of functional components (e.g., IP, I/O interfaces, memory, and the like) inside a running NPU or SoC. For this purpose, it is first necessary to resolve a conflict that occurs while performing a test on a functional component that is selected as a CUT, which causes access to the functional component.

To resolve the conflict problem, the functional component shall be monitored for being in an idle state, and if monitored as idle, the functional component shall be switched from a normal operation mode to a test operation mode, and then the test shall be performed. If a conflict is detected during the test, the functional component shall be switched back to the normal mode of operation. After switching to the normal mode of operation, the functional component shall be able to process input data correctly.

For this purpose, the wrapper 190 shown is disposed between each functional component and the NPU controller

130. The wrapper 190 may include multiplexer gates to selectively control inputs and outputs for each mode of operation.

As shown, when the TEST_ENABLE port is ON, a test vector may be input to the CUT, and the TEST_OUTPUT port may transmit an output. The data output from the above wrapper 190 may be passed to other functional components via the system bus. On the other hand, test results may be passed directly to the ICT 170. The ICT 170 may receive the test vector for the test from the external memory or the internal memory, and store the results of the test in the internal memory or the external memory, or transmit them externally.

To perform a test of the running NPU, the ICT 170 may perform several steps. First, the ICT 170 may select the functional components to be tested as CUTs based on certain rules. Since the NPU is running, the CUT must still be able to respond to accesses from the system bus, thus, it may be effective to select a functional component as a CUT that is as idle as possible. To this end, the ICT 170 may monitor whether a functional component enters an idle state. If the functional component enters an idle state, the wrapper 190 may turn on the TEST_ENABLE port. The ICT 170 may inject a test vector into the corresponding CUT through the TEST_ENABLE port.

The ICT 170 may collect and analyze test results from the CUT via the TEST_OUTPUT port of the wrapper 190. If the test results indicate that a problem has been detected, the ICT 170 may perform a post action. If, during the test, normal access to the CUT from the controller 130 is detected, the ICT 170 may temporarily delay access from the controller 130, and then immediately stop the test. Then, the ICT 170 may recover the previous values for setting registers of the CUT and turn off the TEST_ENABLE port of the wrapper 190. Once all preparations for normal operation of the CUT are complete, the ICT 170 may control the wrapper 190 to return connections for input and output to and from the CUT to the controller 130.

In the following, the foregoing will be described in more detail, organized by table of contents, for better understanding.

I. Why Test During the Runtime is Important

In order to prevent potential accidents which may be caused by hardware defects in the autonomous computing system, various studies have been conducted.

Among various tests, a pre-deployment test is included. According to this test technique, all hardware designs are checked before selling the product to the clients. After the manufacturing, the design is tested from various viewpoints to detect and correct various problems which may be found during the actual operation. For example, in order to test a chip design, a test pattern is provided to perform the scanning of an input and inspection for an output result. Even though this technique may minimize a potential problem for the hardware design before the shipment of the products, the problems of the defect during the runtime which may be caused due to the aging of the integrated circuits (ICs), external environments, and vulnerabilities of the complex designs cannot be solved.

As described above, the above-described pre-deployment test cannot effectively solve the hardware defects so that the inventor began to be interested in test methods during the runtime.

From a viewpoint of test mechanism, the pre-deployment test and the post-deployment test seem to be similar, but there is an obvious difference in when the test can be performed. Specifically, the pre-deployment test may be performed only at a specific time and generally may be allowed only shortly after the manufacturing. In contrast, the test during the runtime may be performed at any time in a normal operation situation.

There may be two test techniques for the test during the runtime including a function test and a scan test.

According to the function test, a test input is generated and an output result obtained by inputting the generated test input to an original design is compared with an intended pattern. Alternatively, based on an original design, according to the function test, input and output signals are monitored to detect an abnormality.

According to the scan test, architectures for the scan test are inserted into the original design and various test patterns need to be created as many as possible. As described, after preparing the scan architectures and the test patterns, the test during the runtime may be performed in various ways.

In order to perform the scan test, the ICT may connect the plurality of flip-flops in each CUT, inject the test input to at least one flip-flop, and acquire a test result from an operation of a combinational logic of the flip-flop to analyze whether the CUT is defective or normal during the runtime.

Figure 9:
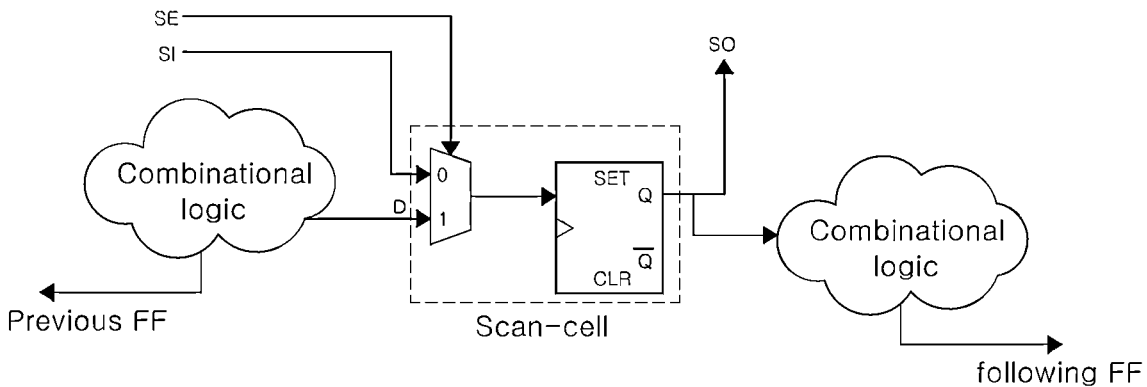
FIG. 9 is an example of scanning a flip-flop.

FIG. 9 illustrates an example of scanning a flip-flop.

In order to more easily design the hardware and minimize the manufacturing defect, it is very important to apply a design for testability (DFT).

To this end, an architecture for the scan test is reflected to the design and a test range with a specific ratio for all detectable defects is defined to perform the test.

When a D-type flip-flop is used, the architecture for the scan test may be easily reflected to the design. During the test, all flip-flops in the CUT may operate as scan flip-flops including the D-flip-flops and multiplexers.

As compared with the normal D-type flip-flop, as illustrated in FIG. 9, the flip-flop may use two additional pins, that is, a scan enable (SE) pin and a scan in (SI) pin. The SI pin is for test input and the SE pin enables the switching between an input D pin for a normal operation and a test input SI for a test operation.

II. Test Via ICT

There may be two different testing techniques: functional testing and scan testing.

The functional test is to generate test inputs, input the generated test inputs into the designed circuitry, and compare the output results with the intended pattern. Alternatively, based on the designed circuitry, the functional test may monitor the input and output signals to detect anomalies.

Said scan test is to connect a plurality of flip-flops in each CUT to each other, inject a test input into at least one flip-flop, and obtain a test result from the operation of the combinational logic of said flip-flops to analyze during operation whether the CUT is defective or normal.

Functional test and scan injection test have their own advantages and disadvantages. Compared to functional test, scan injection test has the disadvantage of using more memory and time delay, but it has the advantage of a wider test coverage.

The above-described test is performed as a background task so that the test may be performed without degrading a system performance. Based on the monitoring of an operation of a component to be tested, the ICT may determine whether the component is in an idle state. When the component is in an idle state, the test is performed so that the degradation of the system performance may not be caused. The ICT consistently monitors the operation state of the CUT on the system bus and the CUT may respond to an unexpected access. When there is access to the CUT, an operation of the CUT is switched from a test operation to a normal operation to recover the CUT and come back the CUT to the normal operation. A slight time delay may occur for the switching. According to the present disclosure, the system bus may be efficiently used during the time delay to minimize the degradation of the system performance due to the recovery.

Figure 10:
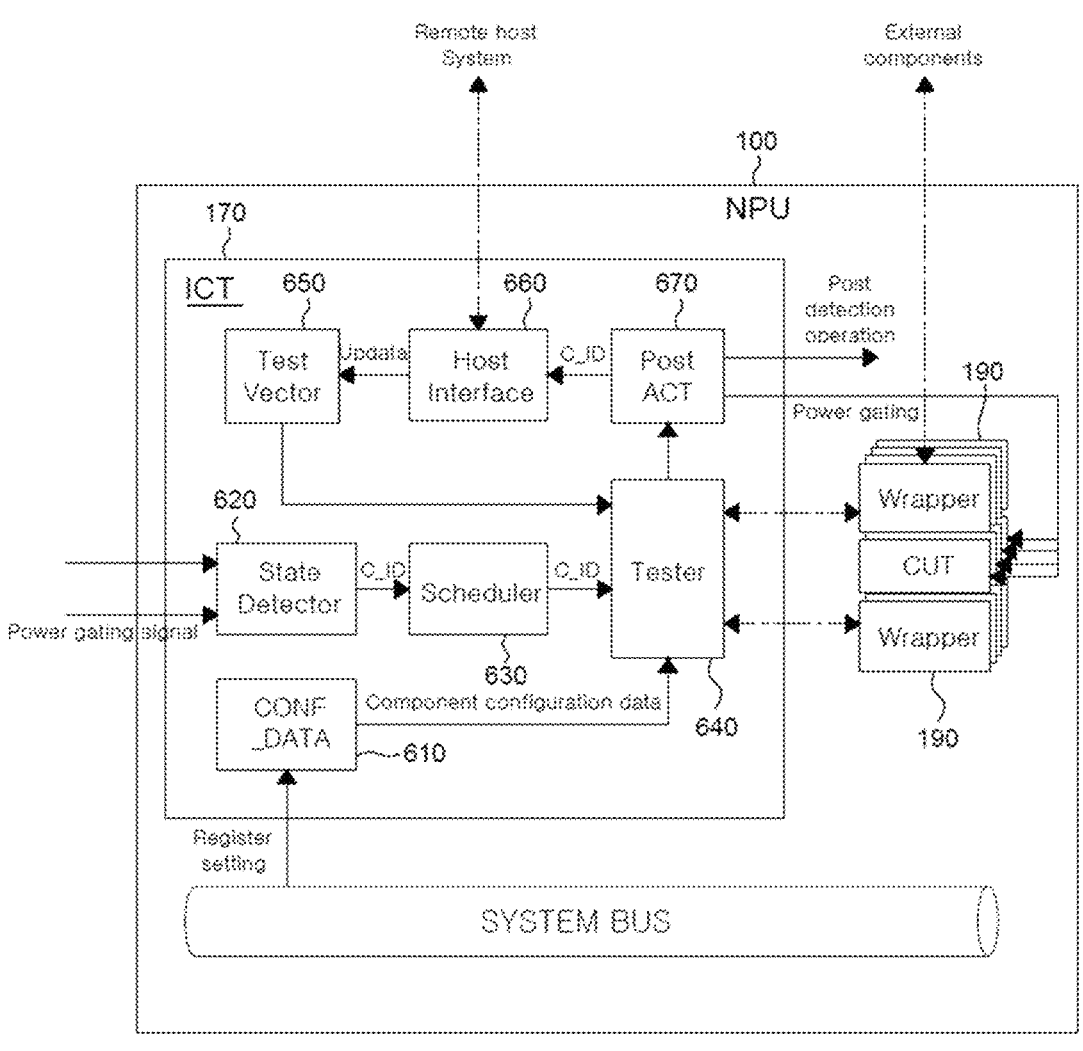
FIG. 10 is an exemplary diagram illustrating an internal configuration of an ICT.

FIG. 10 illustrates an internal configuration of an ICT.

Referring to FIG. 10, the ICT 170 may include a configuration data (CONF_DATA) restorer 610, a state detector 620, a scheduler 630, a tester 640, a test vector generator 650, a host interface 660, and a post action (POST_ACT) unit 670.

The state detector 620 may detect whether the functional components in the NPU are in an idle state or a busy state (or a processing state). When an arbitrary functional component enters an idle state, the state detector 620 transmits an ID (C_ID) of the functional component to the scheduler 630 to perform the test.

The scheduler 630 may manage an overall operation of the ICT 170. The scheduler 630 may receive a state of the functional component from the state detector 620 and trigger the test. The scheduler 630 may transmit the ID of the component to the tester.

The tester 640 controls the wrapper 190, transmits a test vector, acquires a test result, and then compares whether the test result matches an intended test result. Thereafter, the tester 640 may transmit the test result to the post-action unit 670. The tester 640 may restore the register setting for the functional component selected as the CUT to its original value.

The test vector generator 650 may generate a test vector (or a predefined test input data) and a corresponding intended test result. The test vector generator 650 may include a buffer, a memory interface, a memory which stores the test vector and the intended test result, and a random number generator. When the test starts, a test pattern for generating the test vector may be loaded in the buffer. The random number generator may be used to generate the test vector. The random number generator may allow the memory not to store all the test vectors, but generate various test vectors.

When the ID (for example, C_ID) of the functional component from which a problem is found is received from the tester 640, the post action unit 670 may perform the post action. The post action may isolate the defective functional component or notify a defect to the user or a remote host device.

The host interface 660 may report the functional component from which the problem is found during the test process to the user or the remote host device. If there is a change related to the test operation, the host interface 660 may notify the remote host device.

When the test is completed or the access to the functional component selected as CUT from the system bus is detected during the test process, the configuration data restorer 610 may restore the register setting of the CUT to allow the tester 640 to switch the CUT to the normal operation mode. Most of the functional components may have a specific register setting value for a normal operation.

Accordingly, the configuration data restorer 610 may store the register setting value of the functional component before performing the test and restore the register setting value to the functional component when the CUT needs to be switched to the normal operation mode.

Meanwhile, the test vector generator 650 may include at least one of a random number generator, a predefined test data storage unit, and a temp register.

A method of testing a plurality of processing elements 110 using a random number will be described. The random number generator may generate a random number based on a predetermined seed or a seed that is programmed.

The ICT 170 may instruct to select at least one PE in a plurality of processing elements to start a test.

As a specific example, when it is determined that a certain percentage of PEs (e.g., 20% of all PEs) among the plurality of processing elements are in an idle state, the ICT 170 may start a test. In other words, when the ratio of idle PEs among all PEs is equal to or greater than the threshold, the test can be started.

As a specific example, the ICT 170 may select a certain percentage of PEs (e.g., 50% of PEs among all PEs) and start the test.

When the test is performed, the inference speed of the NPU, that is, IPS (inference per second) may be reduced. That is, the inference speed may be lowered according to the number of PEs to be tested. For a specific example, if 50% of PEs among all PEs are tested, the inference speed may be reduced by about 50%, and if 30% of PEs among all PEs are tested, the inference speed during testing may be reduced by about 30%.

Accordingly, according to an example, the plurality of processing elements 110 may further include additional PEs so that the speed degradation according to the test is improved. That is, the plurality of processing elements 110 may include a first group of PEs and a second group of PEs. The plurality of PEs in the first group may be used for learning or inference. The plurality of PEs in the second group are redundant PEs. If a test is performed on the plurality of PEs of the first group, the plurality of PEs of the second group may be used for learning or inference to avoid performance degradation due to the test.

For another example, when the NPU 100 operates below a predetermined inference per second (IPS) value, the ICT 170 may instruct the plurality of processing elements 110 to perform a test. Specifically, assuming that the NPU 100 can operate at a maximum of one hundred IPS, and assuming that the threshold IPS value is thirty IPS, in such case, the ICT 170 may instruct the NPU 100 to perform a test in the remaining time when the NPU 100 operates at thirty IPS or more. For example, when the NPU 100 operates at forty IPS, the test may be performed using the remaining time for sixty IPS. Therefore, a substantial decrease in the speed of the NPU may not occur.

For another example, when the data transferred from the main memory 300 shown in FIG. 7A to the memory 120 is delayed and the NPU 100 becomes an idle state or enters a data starvation period, the ICT 170 may instruct the plurality of processing elements 110 to perform a test.

When a test is performed on the plurality of processing elements 110, the register file RF corresponding to each PE is initialized with predetermined test input data, and the corresponding PE may perform inferences based on the test input data in the register file RF. The predetermined test input data may be a functional test or a partial functional test for the NPU.

When the test for the plurality of processing elements 110 is performed, the random number generator generates a random number as described above. Then, the register file (RF) is initialized by the generated random number, and the corresponding PE performs inference according to the random number in the register file (RF).

The register file (RF) may reset the flip-flops within each PE, and may deliver test input data to the PEs as described above.

Each RF may be, for example, 1 Kb in size.

II-5. Operation Order of ICT

Figure 11:
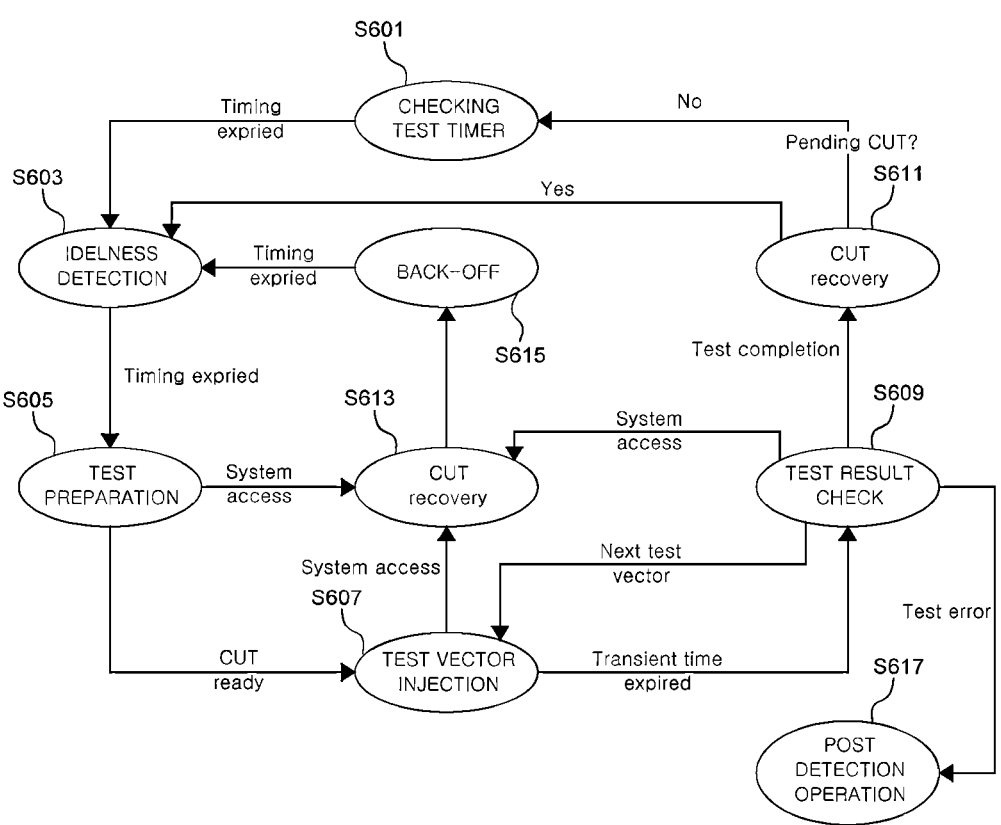
FIG. 11 is an exemplary diagram illustrating an operation sequence of an ICT.

FIG. 11 illustrates an operation order of an ICT.

Referring to FIG. 11, when a timer related to the test start of the ICT in the runtime expires (S601), the ICT monitors whether an arbitrary functional component is in an idle state and detects a functional component in an idle state (S603).

By doing this, the ICT performs a test preparation process (S605). The test preparation process may include selecting the functional component as a CUT, isolating the functional component selected as a CUT from the system bus, and generating a test vector as test input data. The isolation from the system bus may mean that the ICT changes the direction of the input and the output on the wrapper which communicates with the functional component selected as the CUT.

The ICT injects the test vector which is the test input data into the CUT S607.

When the test is normally completed, the ICT checks the test result S609. For the checking, the ICT may compare whether the test result matches the intended test result.

When the test result indicates that there is no problem in the functional component selected as the CUT (that is, no defect or damage), the ICT may recover the functional component to a normal operation state S611.

In the meantime, when an access to the functional component selected as the CUT is detected from the system bus during the test preparation or the test, the ICT may recover the functional component selected as the CUT to a normal operation state S613. The recovery may mean that a register setting value of the functional component selected as the CUT is recovered and the direction of the input and the output returns to an original state on the wrapper which communicates with the functional component selected as the CUT.

In this case, the ICT drives a back-off timer S615 and when the back-off timer is expired, may return to the step S603.

In the meantime, when the test result indicates that there is a problem in the functional component selected as the CUT (that is, the defect or damage), the ICT may perform the post-operation S617.

II-6. Test for Internal Memory

The internal memory 120 may include a plurality of memory instances. The internal memory 120 may further include extra memory instances, i.e., the internal memory 120 may include a first group of memory instances and a second group of memory instances. If a test is performed on the memory instances of the first group, the memory instances of the second group may be used to solve the problem of insufficient storage capacity.

Figure 12:
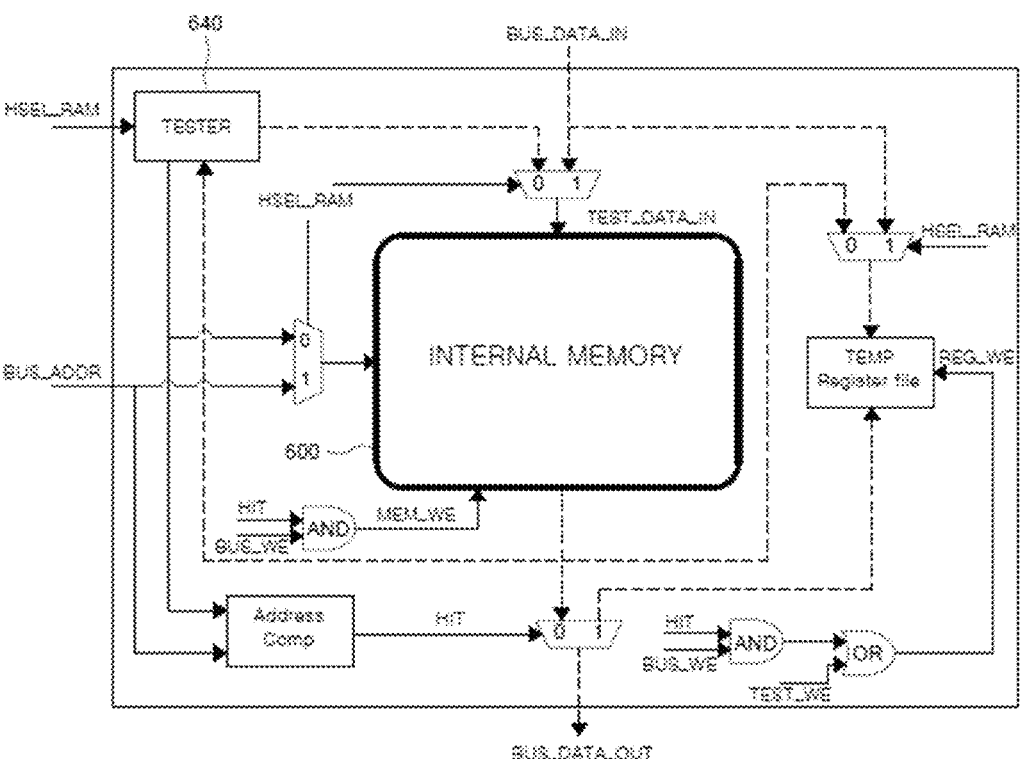
FIG. 12 is a block diagram illustrating a test process for internal memory.

FIG. 12 illustrates a test process of an internal memory.

The test for the internal memory may be different from the test for the functional component. Hereinafter, two test techniques for the internal memory, that is, the internal memory 120 as illustrated in FIG. 1, FIG. 3, FIG. 6A, through FIG. 7A will be proposed.

A first technique is a technique of detecting an error using an error detection code during a process of reading data from the internal memory. If an error detection code acquired during the reading process is different from a predetermined error detection code, the ICT may determine the code as an error.

A second technique is a technique of performing a read-write test in a hard way during a normal operation.

FIG. 12 illustrates the second technique. A test logic which encloses the internal memory may perform the read-write test during the runtime of the system and bypass the access from the system bus. In order to completely process the test, the tester in the ICT may be responsible for the address management. The illustrated temporally register file may temporally store original data which is prone to be deleted due to the test. When the test is completed, the original data in the temporary register file may be recorded in the internal memory again.

If an unpredictable access occurs during the test, data on the system bus may be recorded in the temporary register file, and in contrast, the data in the temporary register file may move to the system bus.

The test technique as described above may be applied not only to the internal memory, but also to the external memory in the same way.

II-7. Operation after Test

When there is a hardware defect in the NPU, the operation after the test may be very important. For example, a user is notified of the defect in order to recommend stopping usage. To this end, the post action unit 670 of FIG. 11 may provide information about the functional component from which the defect is detected and information about test input data (that is, a test vector) which causes the defect. The above-described information may allow the user to know the position of the defective functional component. The usage of the functional component from which the defect is detected needs to be stopped and isolated. In order to prevent the defective functional component from degrading the perfor-mance of the entire system, the output signal of the func-tional component may be replaced by a predetermined signal. Alternatively, the functional component may be reset or gated. Alternatively, the power gating may be performed on the functional component.

In the meantime, when the functional component is iso-lated, the NPU may face another problem. Therefore, even though some functional components have defects, a method for allowing the NPU to still operate needs to be proposed. For example, when the NPU is mounted in a product which requires a high reliability, the NPU needs to further include a spare for some functional components. If some functional components have defects, the spare may operate instead of the functional component. However, when some functional components are duplicated, it may increase an area of the semiconductor device. In order to solve this problem, it may be effective to add a programmable logic in the NPU.

III. Function Test During Runtime or Test for Combination of Functions

Figure 13:
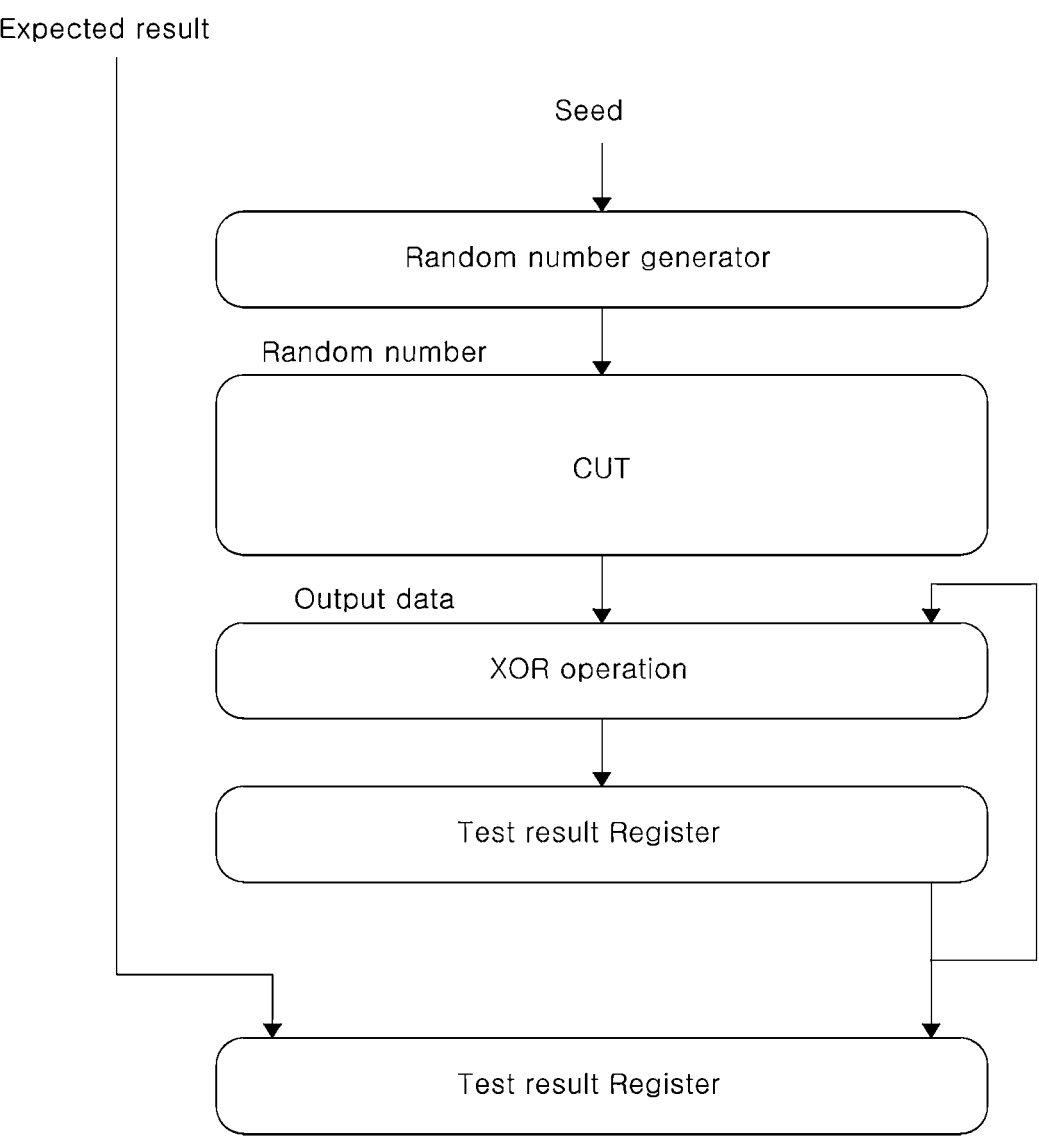
FIG. 13 is an exemplary diagram illustrating a process of performing a functional test using a random number generator.

FIG. 13 illustrates a process of testing a function using a random number generator.

The function test is a test of injecting test input data (for example, a test vector) into a CUT and comparing whether an output from the CUT matches an intended output. In order to correctly evaluate based on the comparison, each input data needs to accurately induce an intended output. A test coverage of the test input data needs to be sufficient to detect all defects.

In a specific design, there may be two test input data for the function test. First, a random number generator which is connected to an XOR operation may be used for the test operation illustrated in FIG. 13. Generally, the random number generator may generate a pseudo random number stream based on an input seed. The random number stream is injected into the CUT via the wrapper and the output is accumulated and stored in the test result register by means of the XOR operation. When the test is completed, the values stored in the test result register may be compared with the intended result corresponding to the test input data. If there is a difference in the comparison result, an error notification may be issued.

Second, all test patterns for test input data and corre-sponding prediction results may be fixed, respectively and stored in the internal memory in the NPU or an external memory. When the test input data (that is, a test vector) from the memory is input to the CUT, the output from the CUT and the intended result corresponding to the test input data may be compared.

In order to perform the function test during the runtime of the NPU, the ICT plays an important role to transmit data and communicate with the system bus, and monitor the state of the CUT. Specifically, when the CUT is in an idle state, the ICT needs to determine when the test is performed. During the test, the random number generator generates a random number stream as test input data and transmits the test input data to the CUT. If there is a difference between the test result and the intended test result, the ICT transmits the information to the post action unit.

During the function test, the functional components may be used so that generally, a frequency for the test operation needs to be lower than or equal to a frequency for a normal operation to avoid the difference of the timing (that is, timing violation). In order to perform the test in real time during the normal operation, it is effective to perform the test when the functional component is in an idle state. Therefore, there is no choice but to perform the test at a high frequency.

Especially when the NPU is used in products that require high reliability, such as autonomous vehicles, drones, urban air mobility (UAM), and unmanned aerial vehicles (UAVs), scan injection test is advantageous because of its wide test coverage. Scan inject test may increase frequencies so as to reduce test time. A long test time is undesirable because it can increase the likelihood of an automobile accident. Scan injection test can increase the frequency for test operation, which allows more test patterns to be injected during idle time and allows hardware faults within the NPU to be detected sooner. General functional test may have the advan-tage of lower power consumption, but in high-reliability environments such as autonomous vehicles, drones, urban air mobility (UAM), and unmanned aerial vehicles (UAVs), safety may be more important than power consumption.

<Aging Test>

The scan test, functional test, and memory test described above may also be performed for aging test.

Aging test, also known as reliability testing or stress test, is an important process in semiconductor manufacturing and quality control. The purpose of aging test is to evaluate the long-term performance and reliability of semiconductors under various operating conditions and stressors. These tests are performed to identify potential defects, weaknesses, or reliability issues in the semiconductor and to ensure that it meets specified quality and reliability criteria before it is released to the market. Key aspects of aging test include the following:

Overall, aging testing is an integral part of semiconductor manufacturing to ensure the quality, reliability, and longev-ity of electronic components. These tests help identify and resolve potential problems early in the manufacturing pro-cess, which can ultimately improve the reliability of elec-tronic devices that use semiconductors.

A. Purpose of Aging Test

A-1) Reliability test: Aging tests may be performed to evaluate how a semiconductor device performs over an extended period of time beyond its normally expected operating life.

A-2) Failure prediction: Aging tests may help predict potential failure, degradation or wear mechanisms that may occur during the life of the device.

A-3) Quality control: Aging tests may be performed by manufacturers to ensure that products thereof meet quality and reliability specifications.

B. Applied Stress Factors

Aging tests can subject semiconductor devices to various stresses, such as elevated temperatures, voltage fluctuations, humidity, thermal cycling, and the like. Since these factors accelerate fatigue and aging, they can simulate actual operating conditions.

C. Aging Test Types

Temperature stress testing: Semiconductors can be exposed to high temperatures to accelerate aging. This test is also called thermal aging.

Voltage stress test: Semiconductors can be operated at higher than normal voltages to evaluate their performance under electrical stress.

Humidity testing: Humidity chamber testing can evaluate how a semiconductor performs in a high humidity environment.

Thermal cycling: Semiconductors can be exposed to rapid temperature changes to simulate temperature cycling in real-world applications.

D. How Long to Perform Aging Tests

Aging tests can vary in duration depending on the desired results. Short-term tests can last for hours or days, while long-term tests can last for weeks, months, or years.

E. Data Collection

Throughout the aging test, data can be collected on the device's performance, such as electrical characteristics, functionality, and reliability parameters.

F. Failure Analysis

If a semiconductor fails during aging testing, failure analysis can be performed to determine the root cause of the failure and improve the design or manufacturing process.

G. Field Test

In addition to laboratory aging test, some semiconductor devices may be subjected to field test to evaluate their performance in real-world applications.

In one example, the scan test and memory test described above may be performed repeatedly for field testing, which is a type of aging test.

Specifically, an aging test may be performed in which scan tests and memory tests are repeatedly performed to accumulate fatigue and age the NPU 100 or SoC 1000.

The aging test may be performed when the NPU or SoC is in a test mode.

When the NPU or SoC is idle, the NPU or SoC may enter the test mode. Alternatively, at certain intervals, the NPU or SoC may stop operating and enter the test mode. Alternatively, if the NPU or the SoC is mounted in an autonomous vehicle, drone, UAM, or UAV, and the like, it may enter the test mode as soon as it is turned on. After the aging test is performed a number of times in the test mode, and the results are diagnosed as normal, operation may commence. Alternatively, the NPU or the SoC may enter the test mode after the autonomous vehicle, drone, UAM, or UAV has stopped driving and before it is turned off, i.e., when the autonomous vehicle or drone is stopped driving and a user attempts to turn it off, it may enter the test mode.

Figure 14:
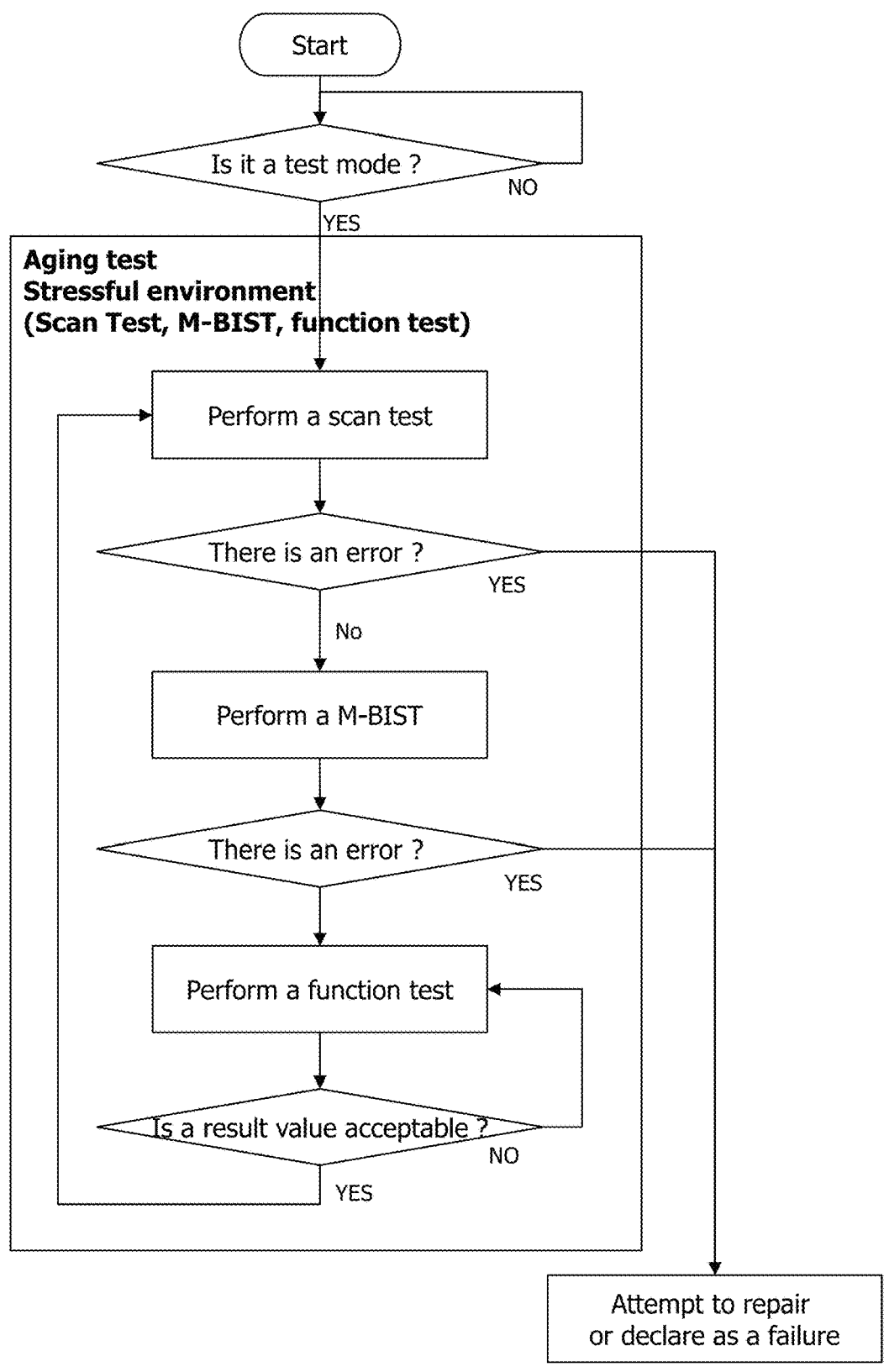
FIG. 14 is an exemplary diagram illustrating an exemplary procedure for aging test.

FIG. 14 is an exemplary diagram illustrating an exemplary procedure for aging test.

Referring to FIG. 14, when the NPU or the SoC enters a test mode, a scan test may be performed. A scan test refers to connecting a plurality of flip-flops in each functional component to each other to form one or more scan chains, as described above, and then injecting a test input into at least one of the plurality of flip-flops, and obtaining a test result from the operation of the combinational logic of at least one of said plurality of flip-flops to analyze whether each functional component is defective or normal.

Then, it is determined whether there is an error as a result of performing the above scan test. If it is determined that there is an error, a repair can be attempted. If it cannot be repaired, it is declared as a failure and switched to an unusable state. If it can be repaired, it is recorded as available.

Next, a memory test, or memory built-in self-test (M-BIST), is performed. As a result of the above memory test, it determines whether there is an error. If it is determined that there is an error, it tries to repair it. If it cannot be repaired, it is declared as a failure and goes into an unavailable state. If it can be repaired, record it as available.

Next, perform functional tests. If the result of the functional test is abnormal, repeat the functional test.

However, if the result of the functional test is normal, return to the step of performing the scan test and repeat it.

The above iteration may be repeated a predetermined number of times.

<Summary of the Examples of the Present Disclosure>

According to an example of the present disclosure, a method for performing an aging test on a neural processing unit (NPU) with a capability of a runtime test may be provided. The method may comprise: performing an aging test on the NPU having a plurality of functional components. The plurality of functional components may comprise at least one memory and a plurality of processing elements. The performing of the aging test may include: performing a scan test on the NPU to verify whether at least one functional component of the plurality of functional components in the NPU is defective or not; and performing a memory test on the at least one memory. At least one of the scan test and the memory test may be repeatedly performed to put a stress on the NPU for the aging test. The aging test may be repeated by a predetermined number.

According to an example of the present disclosure, a method for performing an aging test on a system on chip (SoC) with a first capability for an artificial neural network and a second capability of a runtime test may be provided. The method may comprise: performing an aging test on the SoC having a plurality of electronic circuitry having a plurality of functional components. The plurality of functional components may comprise at least one neural processing unit (NPU), at least one memory and a system bus. The performing of the aging test may include: performing a scan test on the SoC to verify whether at least one functional component of the plurality of functional components in the SoC is defective or not; and performing a memory test on SoC. At least one of the scan test and the memory test may be repeatedly performed to put a stress on the SoC for the aging test. The aging test may be repeated by a predetermined number.

The memory test may include a Memory Built-In Self-Test (M-BIST).

The aging test may be performed when the NPU or SoC is in a test mode.

If the aging test is finished, the NPU or SoC may be switched from the test mode to a runtime mode.

The scan test may include: forming one or more scan chains by connecting a plurality of flip-flops to each other in each functional component, injecting a test input into at least one of the plurality of flip-flops, and acquiring a test result from operations of combinational logics of the at least one of the plurality of flip-flops to analyze whether each functional component is defective or normal.

The performing of the aging test may further comprise: performing a function test on the NPU or SoC.

The performing of the function test may comprise: inputting a test input data into the NPU or SoC which operates a first artificial neural network (ANN) model pre-set for the function test; and checking whether the NPU or SoC operates normally or erroneously by verifying whether a test result acquired from the NPU or SoC into which the test input data is inputted matches a preset test result.

The performing of the scan test on the NPU or SoC may further comprise: selecting, as a component under test (CUT), the at least one functional component of the plurality of the functional components, by an in-system component tester (ICT); and performing the scan test on the at least one functional component selected as the CUT, by the ICT.

The NPU or SoC further comprise: one or more wrappers, each being connected to the at least one functional component of the plurality of functional components.

The one or more wrappers may allow the at least one functional component to be isolated during the scan test.

The one or more wrappers prevent the at least one functional component from being disrupted by any access during the scan test. The any access may be requested by another functional component of the plurality of functional components in the NPU or SoC.

The examples of the present disclosure disclosed in the present specification and the drawings merely provide a specific example for easy description and better understanding of the technical description of the present disclosure, but are not intended to limit the scope of the present disclosure. It is obvious to those skilled in the art that other modifications are possible in addition to the examples described so far.

[National R&D Project Supporting This Disclosure]
[Task Identification Number] 1711193247
[Task Number] 2022-0-00248-002
[Name of Ministry] Ministry of Science and ICT
[Name of Project Management (Specialized) Institution] Institute of Information & Communications Technology Planning & Evaluation
[Research Project Title] Development of Core Technology for PIM Artificial Intelligence Semiconductor (Design)
[Research Task Title] Development of CXL-based PIM semiconductor technology for multiple DRAM modules considering memory consistency
[Contribution Rate]1/1
[Name of Organization Performing the Task] DeepX Co., Ltd.
[Research period15 minutes] 2023-01-01~2023-12-31

What is claimed is:

1. A method for performing an aging test on a neural processing unit (NPU) with a capability of a runtime test, comprising:
   performing an aging test on the NPU having a plurality of functional components, wherein the plurality of functional components comprise at least one memory and a plurality of processing elements,
   wherein the performing of the aging test includes:
      performing a scan on the NPU to verify whether at least one functional component of the plurality of functional components in the NPU is defective or not; and
      performing a memory test on the at least one memory,
   wherein at least one of the scan test and the memory test is repeatedly performed to put a stress on the NPU for the aging test, and
   wherein the aging test is repeated by a predetermined number.

2. The method of claim 1,
   wherein the memory test includes a Memory Built-In Self-Test (M-BIST).

3. The method of claim 1,
   wherein the aging test is performed when the NPU is in a test mode.

4. The method of claim 3,
   wherein if the aging test is finished, the NPU is switched from the test mode to a runtime mode.

5. The method of claim 1,
   wherein the scan test includes:
      forming one or more scan chains by connecting a plurality of flip-flops to each other in each functional component,
      injecting a test input into at least one of the plurality of flip-flops, and
      acquiring a test result from operations of combinational logics of the at least one of the plurality of flip-flops to analyze whether each functional component is defective or normal.

6. The method of claim 1,
   wherein the performing of the aging test further comprises: performing a function test on the NPU.

7. The method of claim 6,
   wherein the performing of the function test comprises:
   inputting a test input data into the NPU which operates a first artificial neural network (ANN) model pre-set for the function test; and
   checking whether the NPU operates normally or erroneously by verifying whether a test result acquired from the NPU into which the test input data is inputted matches a preset test result.

8. The method of claim 1,
   wherein the performing of the scan test on the NPU comprises:
   selecting, as a component under test (CUT), the at least one functional component of the plurality of the functional components, by an in-system component tester (ICT); and
   performing the scan test on the at least one functional component selected as the CUT, by the ICT.

9. The method of claim 1,
   wherein the NPU further comprises: one or more wrappers, each being connected to the at least one functional component of the plurality of functional components.

10. The method of claim 9,
   wherein the one or more wrappers allow the at least one functional component to be isolated during the scan test.

11. The method of claim 9,
   wherein the one or more wrappers prevent the at least one functional component from being disrupted by any access during the scan test.

US 12,658,280 B2

35

12. The method of claim 11,
wherein the any access is requested by another functional component of the plurality of functional components in the NPU.

13. A method for performing an aging test on a system on chip (SoC) with a first capability for an artificial neural network and a second capability of a runtime test, the method comprising:
performing an aging test on the SoC having a plurality of electronic circuitry having a plurality of functional components,
wherein the plurality of functional components comprise at least one neural processing unit (NPU), at least one memory and a system bus,
wherein the performing of the aging test includes:
performing a scan test on the SoC to verify whether at least one functional component of the plurality of functional components in the SoC is defective or not; and
performing a memory test on SoC,
wherein at least one of the scan test and the memory test is repeatedly performed to put a stress on the SoC for the aging test, and
wherein the aging test is repeated by a predetermined number.

14. The method of claim 13,
wherein the memory test includes a Memory Built-In Self-Test (M-BIST).

15. The method of claim 13,
wherein the aging test is performed when the SoC is in a test mode.

36

16. The method of claim 15,
wherein if the aging test is finished, the SoC is switched from the test mode to a runtime mode.

17. The method of claim 13,
wherein the scan test includes:
forming one or more scan chains by connecting a plurality of flip-flops to each other in each functional component,
injecting a test input into at least one of the plurality of flip-flops, and
acquiring a test result from operations of combinational logics of the at least one of the plurality of flip-flops to analyze whether each functional component is defective or normal.

18. The method of claim 15,
wherein the performing of the aging test further comprises: performing a function test on the SoC.

19. The method of claim 18,
wherein the performing of the function test comprises:
inputting a test input data into the SoC which operates a first artificial neural network (ANN) model pre-set for the function test; and
checking whether the SoC operates normally or erroneously by verifying whether a test result acquired from the SoC into which the test input data is inputted matches a preset test result.

20. The method of claim 13,
wherein the SoC further comprises: one or more wrappers, each being connected to the at least one functional component of the plurality of functional components.

* * * * *